(12) United States Patent
Schwartz et al.

(10) Patent No.: US 9,880,209 B2
(45) Date of Patent: Jan. 30, 2018

(54) CAPACITIVE SENSING ON LARGE TOUCH SCREENS

(71) Applicant: Synaptics Incorporated, San Jose, CA (US)

(72) Inventors: Adam Schwartz, Redwood City, CA (US); Richard R. Schediwy, Union City, CA (US); Joseph Kurth Reynolds, Alviso, CA (US); Kirk Hargreaves, Sunnyvale, CA (US)

(73) Assignee: Synaptics Incorporated, San Jose, CA (US)

( * ) Notice: Subject to any disclaimer, the term of this patent is extended or adjusted under 35 U.S.C. 154(b) by 55 days.

(21) Appl. No.: 14/804,193

(22) Filed: Jul. 20, 2015

(65) Prior Publication Data

US 2015/0324036 A1 Nov. 12, 2015

Related U.S. Application Data

(63) Continuation of application No. 14/085,606, filed on Nov. 20, 2013, now Pat. No. 9,354,264, which is a
(Continued)

(51) Int. Cl.
*G01R 27/26* (2006.01)
*G06F 3/041* (2006.01)
*G06F 3/044* (2006.01)

(52) U.S. Cl.
CPC ......... *G01R 27/2605* (2013.01); *G06F 3/044* (2013.01); *G06F 3/0416* (2013.01)

(58) Field of Classification Search
CPC .......................... G06F 3/0416; G01R 27/2605
(Continued)

(56) References Cited

U.S. PATENT DOCUMENTS

| 5,495,077 A | 2/1996 | Miller et al. |
| 5,534,892 A | 7/1996 | Tagawa |

(Continued)

FOREIGN PATENT DOCUMENTS

| CN | 101393502 A | 3/2009 |
| CN | 101553711 A | 10/2009 |

(Continued)

OTHER PUBLICATIONS

US 8,406,363, 03/2013, Kato et al. (withdrawn)
(Continued)

*Primary Examiner* — Jeff Natalini
(74) *Attorney, Agent, or Firm* — Osha Liang LLP

(57) ABSTRACT

An input device comprises a first plurality of sensor electrodes, a second plurality of sensor electrodes, and a processing system. The processing system comprises a first integrated circuit, a second integrated circuit, and a central controller. The first integrated circuit is coupled to the first plurality of sensor electrodes and configured to receive first resulting signals therewith. The second integrated circuit is coupled to the second plurality of sensor electrodes and configured to receive second resulting signals therewith. The central controller is communicatively coupled to the first and second integrated circuits. The central controller is configured to receive the first resulting signals from the first integrated circuit and the second resulting signals from the second integrated circuit and is configured to determine positional information from the first resulting signals and the second resulting signals and to communicate the positional information to a host processor.

17 Claims, 14 Drawing Sheets

Related U.S. Application Data continuation of application No. 12/970,898, filed on Dec. 16, 2010, now Pat. No. 8,638,107.

(60) Provisional application No. 61/288,124, filed on Dec. 18, 2009.

(58) Field of Classification Search
USPC .......................... 345/173–178; 324/658–690
See application file for complete search history.

(56) References Cited

U.S. PATENT DOCUMENTS

| | | | |
|---|---|---|---|
| 5,790,106 A * | 8/1998 | Hirano | G06F 3/041 |
| | | | 178/18.06 |
| 5,841,078 A | 11/1998 | Miller et al. | |
| 6,377,228 B1 | 4/2002 | Jenkin et al. | |
| 6,525,546 B1 | 2/2003 | Zhao et al. | |
| 7,262,609 B2 | 8/2007 | Reynolds | |
| 7,446,694 B1 | 11/2008 | Ahmed et al. | |
| 7,548,073 B2 | 6/2009 | MacKey et al. | |
| 7,583,092 B2 | 9/2009 | Reynolds et al. | |
| 7,653,883 B2 | 1/2010 | Hotelling et al. | |
| 7,733,557 B2 | 6/2010 | Handschy et al. | |
| 7,777,501 B2 | 8/2010 | Reynolds et al. | |
| 7,848,825 B2 | 12/2010 | Wilson et al. | |
| 7,880,481 B2 | 2/2011 | Zangl et al. | |
| 7,924,029 B2 | 4/2011 | Reynolds et al. | |
| 7,966,884 B2 | 6/2011 | Shikata | |
| 8,159,471 B2 | 4/2012 | Utsunomiya et al. | |
| 8,237,453 B2 | 8/2012 | Badaye et al. | |
| 8,259,078 B2 | 9/2012 | Hotelling et al. | |
| 8,279,194 B2 | 10/2012 | Kent et al. | |
| 8,300,029 B2 | 10/2012 | Lee et al. | |
| 8,362,988 B2 | 1/2013 | Hsieh et al. | |
| 8,415,959 B2 | 4/2013 | Badaye | |
| 8,437,439 B2 | 5/2013 | Kato et al. | |
| 8,458,788 B2 | 6/2013 | Gillespie et al. | |
| 8,482,545 B2 | 7/2013 | King-Smith et al. | |
| 8,564,552 B2 | 10/2013 | Yilmaz | |
| 8,624,856 B2 | 1/2014 | Kim et al. | |
| 8,638,107 B2 | 1/2014 | Schwartz et al. | |
| 8,669,640 B2 | 3/2014 | Lin et al. | |
| 8,686,735 B2 | 4/2014 | Weinerth et al. | |
| 8,884,921 B2 | 11/2014 | Kim et al. | |
| 9,354,264 B2 | 5/2016 | Schwartz et al. | |
| 2006/0038791 A1 | 2/2006 | MacKey | |
| 2006/0227115 A1 | 10/2006 | Fry | |
| 2006/0244734 A1 | 11/2006 | Hill et al. | |
| 2007/0159184 A1 | 7/2007 | Reynolds et al. | |
| 2007/0236477 A1 | 10/2007 | Ryu et al. | |
| 2008/0111795 A1 | 5/2008 | Bollinger | |
| 2008/0116904 A1 | 5/2008 | Reynolds et al. | |
| 2008/0136985 A1 | 6/2008 | Hsieh et al. | |
| 2008/0158177 A1 | 7/2008 | Wilson et al. | |
| 2008/0173094 A1 | 7/2008 | Shikata et al. | |
| 2008/0246496 A1* | 10/2008 | Hristov | G06F 3/044 |
| | | | 324/686 |
| 2008/0252608 A1 | 10/2008 | Geaghan | |
| 2008/0259044 A1 | 10/2008 | Utsunomiya et al. | |
| 2008/0309622 A1 | 12/2008 | Krah | |
| 2009/0033343 A1 | 2/2009 | Reynolds et al. | |
| 2009/0110111 A1 | 4/2009 | Kato et al. | |
| 2009/0160461 A1 | 6/2009 | Zangl et al. | |
| 2009/0267903 A1 | 10/2009 | Cady et al. | |
| 2009/0325643 A1 | 12/2009 | Hamadene et al. | |
| 2010/0085325 A1 | 4/2010 | King-Smith et al. | |
| 2010/0156795 A1 | 6/2010 | Kim et al. | |
| 2010/0159995 A1* | 6/2010 | Stallings | G06F 3/0488 |
| | | | 455/566 |
| 2010/0214232 A1* | 8/2010 | Chan | G06F 3/044 |
| | | | 345/173 |
| 2010/0253651 A1 | 10/2010 | Day | |
| 2010/0258360 A1 | 10/2010 | Yilmaz | |
| 2010/0283760 A1 | 11/2010 | Leung et al. | |
| 2010/0292945 A1 | 11/2010 | Reynolds et al. | |
| 2010/0328255 A1 | 12/2010 | Ishizaki et al. | |
| 2011/0018557 A1 | 1/2011 | Badaye | |
| 2011/0025636 A1 | 2/2011 | Ryu et al. | |
| 2011/0025639 A1 | 2/2011 | Trend et al. | |
| 2011/0062971 A1 | 3/2011 | Badaye | |
| 2011/0095996 A1 | 4/2011 | Yilmaz | |
| 2011/0095997 A1 | 4/2011 | Philipp | |
| 2011/0134055 A1 | 6/2011 | Jung et al. | |
| 2011/0141040 A1 | 6/2011 | Kang et al. | |
| 2011/0141042 A1 | 6/2011 | Kim et al. | |
| 2011/0141051 A1 | 6/2011 | Ryu | |
| 2011/0148435 A1 | 6/2011 | Schwartz et al. | |
| 2011/0148436 A1 | 6/2011 | Dattalo | |
| 2011/0210940 A1 | 9/2011 | Reynolds | |
| 2011/0277030 A1 | 11/2011 | Gillespie et al. | |
| 2012/0032895 A1 | 2/2012 | Westerman et al. | |
| 2012/0050180 A1 | 3/2012 | King et al. | |
| 2012/0050216 A1 | 3/2012 | Kremin et al. | |
| 2012/0062506 A1 | 3/2012 | Chae et al. | |
| 2012/0098791 A1 | 4/2012 | Hamada et al. | |
| 2012/0120006 A1 | 5/2012 | Liu | |
| 2012/0120011 A1 | 5/2012 | Teng et al. | |
| 2012/0207244 A1 | 8/2012 | Weinerth et al. | |
| 2012/0235691 A1 | 9/2012 | Ho et al. | |
| 2012/0268418 A1 | 10/2012 | Ishizaki et al. | |
| 2012/0306802 A1 | 12/2012 | McCracken et al. | |
| 2013/0016065 A1 | 1/2013 | Reynolds et al. | |
| 2013/0043942 A1 | 2/2013 | Konoshita et al. | |
| 2013/0088175 A1 | 4/2013 | Nishikawa et al. | |
| 2013/0113735 A1 | 5/2013 | Takeuchi et al. | |
| 2013/0169340 A1 | 7/2013 | Tao et al. | |
| 2013/0241868 A1 | 9/2013 | Kim et al. | |
| 2013/0285966 A1 | 10/2013 | Kimura et al. | |
| 2013/0335366 A1 | 12/2013 | Lee et al. | |
| 2013/0335367 A1 | 12/2013 | Kim | |
| 2014/0009438 A1 | 1/2014 | Liu et al. | |
| 2014/0022188 A1 | 1/2014 | Ahn | |
| 2014/0043284 A1 | 2/2014 | Park et al. | |
| 2014/0049500 A1 | 2/2014 | Chen et al. | |
| 2014/0103941 A1 | 4/2014 | Chou et al. | |
| 2014/0152324 A1 | 6/2014 | Schwartz et al. | |
| 2014/0152621 A1 | 6/2014 | Okayama et al. | |
| 2014/0167619 A1 | 6/2014 | Land et al. | |
| 2014/0184534 A1 | 7/2014 | Lee et al. | |
| 2014/0184552 A1 | 7/2014 | Tanemura | |
| 2014/0198087 A1 | 7/2014 | Knausz et al. | |
| 2014/0210764 A1 | 7/2014 | Shepelev et al. | |

FOREIGN PATENT DOCUMENTS

| | | |
|---|---|---|
| JP | 2009009249 A | 1/2009 |
| JP | 2009163739 A | 7/2009 |
| JP | 2010108505 A2 | 5/2010 |
| KR | 10-2008-0081411 | 9/2008 |

OTHER PUBLICATIONS

Office Action, U.S. Appl. No. 13/753,369, dated Jan. 5, 2016, 34 pages.
Office Action, U.S. Appl. No. 12/970,898, dated May 23, 2013, 19 pages.
Office Action Search Report, CN Application No. 201080059384.4, 2 pages, dated Sep. 22, 2014 (dated Sep. 22, 2014).
Office Action, JP Application No. 2012-544857, 5 pages, dated Nov. 25, 2014 (dated Nov. 25, 2014).
Office Action, JP Application No. P2012-544857, 2 pages, dated Mar. 11, 2014 (dated Mar. 11, 2014).
Office Action, U.S. Appl. No. 13/753,369, dated Aug. 29, 2014, 24 pages.
Office Action, U.S. Appl. No. 13/753,369, dated Mar. 24, 2015, 41 pages.
Davies, "Synaptics Onyx Concept: Live Demo Captured on Video!", http://www.slashgear.com/synaptics-onyx-concept-live-demo-captured-on-video-051947/, Oct. 5, 2006, 1-14.
Yingst, "Synaptics and Pilotfish Collaborate to Develop Next Generation Mobile Phone Concept", http://www.synaptics.com/about/

(56) References Cited

OTHER PUBLICATIONS press/press-releases/synaptics-and-pilotfish-collaborate-develop-next-generation-mobile-phone-, Aug. 21, 2006, 1-2.
Office Action, U.S. Appl. No. 13/753,369, dated Aug 20, 2015, 29 pages.
Office Action, U.S. Appl. No. 14/085,606, dated Nov. 6, 2015, 29 pages.
Korean Patent Application No. 2012-7015652 Office Action dated Aug. 23, 2016, translation 2 pgs.

* cited by examiner

1600

TRANSMIT A FIRST TRANSMITTER SIGNAL WITH A FIRST TRANSMITTER ELECTRODE OF A PLURALITY OF TRANSMITTER ELECTRODES, WHEREIN THE FIRST TRANSMITTER ELECTRODE IS DISPOSED ON A FIRST SIDE OF AN OHMIC SEAM.
1610

TRANSMIT A SECOND TRANSMITTER SIGNAL WITH A SECOND TRANSMITTER ELECTRODE OF THE PLURALITY OF TRANSMITTER ELECTRODES, WHEREIN THE SECOND TRANSMITTER ELECTRODE IS DISPOSED ON A SECOND SIDE OF THE OHMIC SEAM.
1620

RECEIVE A FIRST RESPONSE CORRESPONDING TO THE FIRST TRANSMITTER SIGNAL WITH A FIRST RECEIVER ELECTRODE OF THE PLURALITY OF RECEIVER ELECTRODES, WHEREIN THE FIRST RECEIVER ELECTRODE IS DISPOSED ON THE FIRST SIDE OF THE OHMIC SEAM.
1630

RECEIVE A SECOND RESPONSE CORRESPONDING TO THE SECOND TRANSMITTER SIGNAL WITH A SECOND RECEIVER ELECTRODE OF THE PLURALITY OF RECEIVER ELECTRODES, WHEREIN THE SECOND RECEIVER ELECTRODE IS ON THE SECOND SIDE OF THE OHMIC SEAM.
1640

FIG. 16A

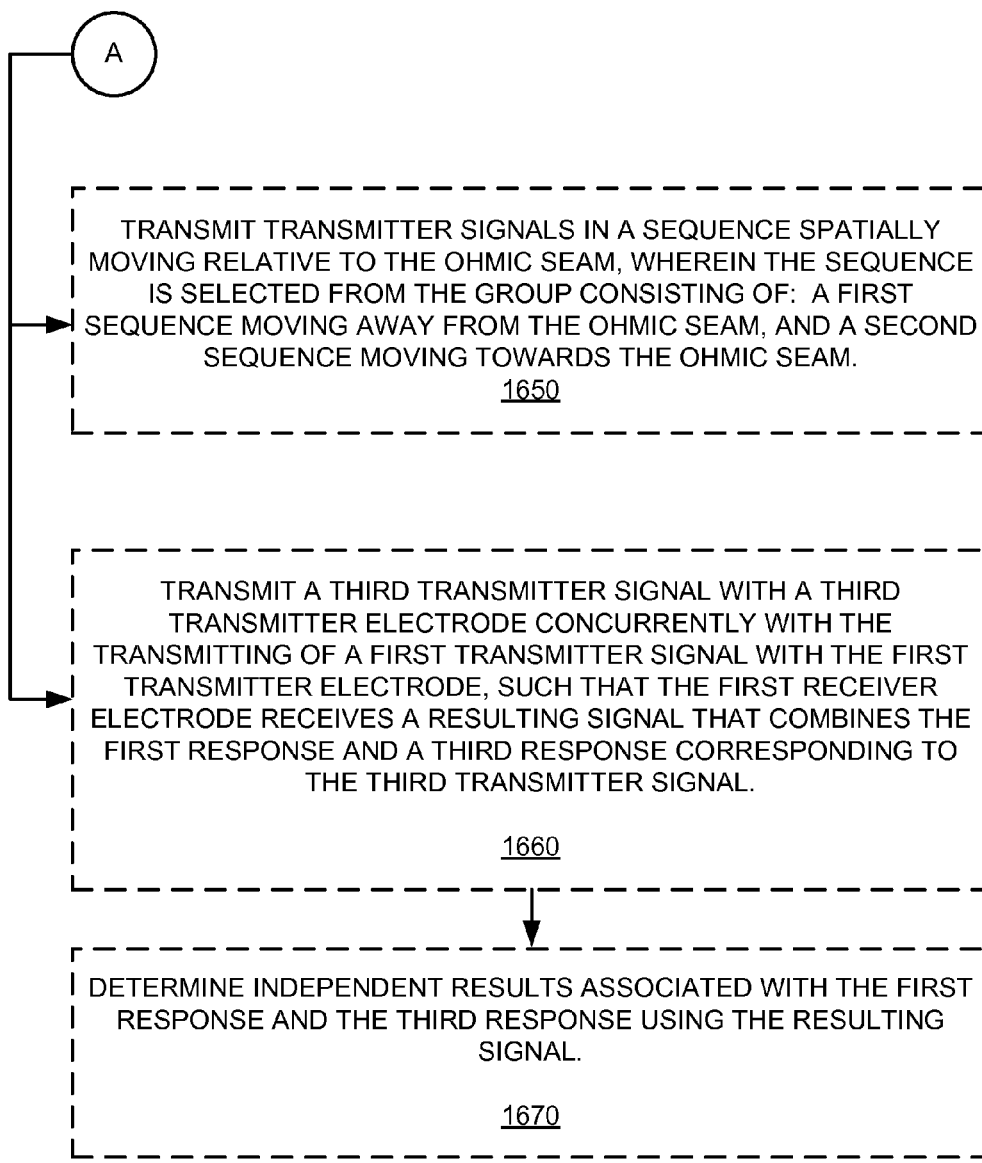

CAPACITIVE SENSING ON LARGE TOUCH SCREENS

CROSS-REFERENCE TO RELATED U.S. APPLICATION (CONTINUATION)

This application is a continuation application of and claims the benefit of co-pending U.S. patent application Ser. No. 14/085,606 filed on Nov. 20, 2013, entitled "Transcapacitive Sensor Devices with Seams" by Adam Schwartz et al., and assigned to the assignee of the present application; U.S. patent application Ser. No. 14/085,606 is herein incorporated by reference in its entirety.

U.S. patent application Ser. No. 14/085,606 is a continuation application of and claims the benefit of U.S. patent application Ser. No. 12/970,898 filed on Dec. 16, 2010, entitled "Transcapacitive Sensor Devices with Ohmic Seams" by Adam Schwartz et al., and assigned to the assignee of the present application; U.S. patent application Ser. No. 12/970,898 is herein incorporated by reference in its entirety.

U.S. patent application Ser. No. 12/970,898 claims priority to and benefit of U.S. provisional patent application 61/288,124, titled "METHOD AND APPARATUS FOR CAPACITIVE SENSING ON LARGE TOUCH SCREENS," filed Dec. 18, 2009 and assigned to the common assignee of U.S. patent application Ser. No. 12/970,898 and the present non-provisional application; U.S. provisional patent application 61/288,124 was incorporated by reference in its entirety into U.S. patent application Ser. No. 12/970,898.

CROSS-REFERENCE TO RELATED U.S. APPLICATION

This application is related to U.S. patent application Ser. No. 13/753,369 filed on Jan. 29, 2013, entitled "INPUT DEVICE," by Petr Shepelev, and assigned to the assignee of the present application.

BACKGROUND

Input devices including proximity sensor devices (also commonly called touchpads or touch sensor devices) are widely used in a variety of electronic systems. A proximity sensor device typically includes a sensing region, often demarked by a surface, in which the proximity sensor device determines the presence, location and/or motion of one or more input objects. Proximity sensor devices may be used to provide interfaces for the electronic system. For example, proximity sensor devices are often used as input devices for larger computing systems (such as opaque touchpads integrated in, or peripheral to, notebook or desktop computers). Proximity sensor devices are also often used in smaller computing systems (such as touch screens integrated in cellular phones).

SUMMARY

A processing system for transcapacitive sensing device comprises a plurality of sensor electrodes sectioned by a seam, a first sensor electrode integrated circuit, and a second sensor electrode integrated circuit. The plurality of sensor electrodes comprises a plurality of transmitter electrodes intersecting a plurality of receiver electrodes. The first sensor electrode integrated circuit is communicatively coupled to a first subset of the plurality of sensor electrodes. The second sensor electrode integrated circuit is communicatively coupled to a second subset of the plurality of sensor electrodes. The first sensor electrode integrated circuit and the second sensor electrode integrated circuit are configured to operate the plurality of sensor electrodes in synchrony to transmit with the plurality of transmitter electrodes a set of transmitter signals and receive with the plurality of receiver electrodes a set of responses corresponding to the set of transmitter signals.

BRIEF DESCRIPTION OF DRAWINGS

The drawings referred to in this Brief Description of Drawings should not be understood as being drawn to scale unless specifically noted. The accompanying drawings, which are incorporated in and form a part of the Description of Embodiments, illustrate various embodiments of the present invention and, together with the Description of Embodiments, serve to explain principles discussed below, where like designations denote like elements, and:

FIG. 16A and FIG. 16B illustrate a flow diagram of an example method of capacitive sensing with a capacitive sensing device comprising a plurality of transmitter electrodes sectioned by an ohmic seam and a plurality of receiver electrodes sectioned by the ohmic seam, according to various embodiments.

DESCRIPTION OF EMBODIMENTS

The following Description of Embodiments is merely is provided by way of example and not of limitation. Furthermore, there is no intention to be bound by any expressed or implied theory presented in the preceding technical field, background, brief summary or the following detailed description.

Various embodiments of the present invention provide input devices and methods that facilitate improved usability.

Figure 1:
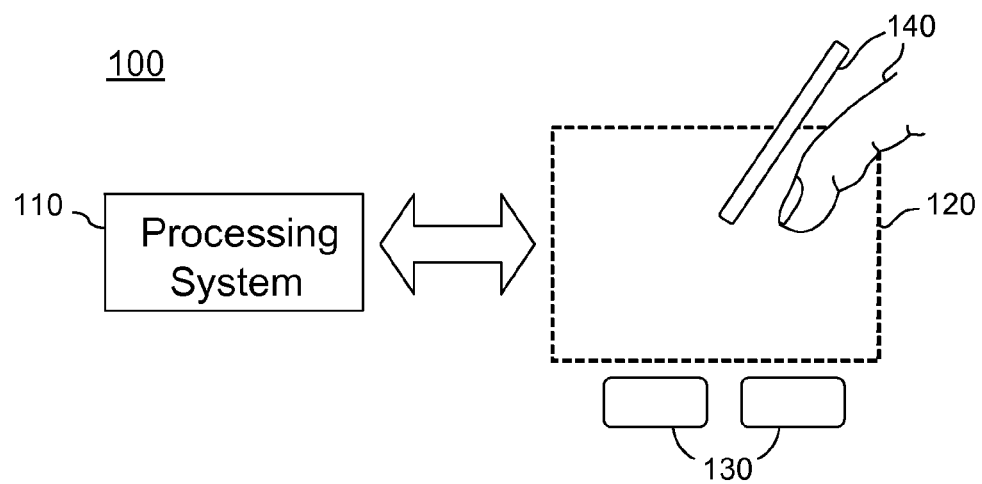
FIG. 1 is a block diagram of an example input device, in accordance with embodiments of the invention.

Turning now to the figures, FIG. 1 is a block diagram of an exemplary input device 100, in accordance with embodiments of the invention. The input device 100 may be configured to provide input to an electronic system (not shown). As used in this document, the term "electronic system" (or "electronic device") broadly refers to any system capable of electronically processing information. Some non-limiting examples of electronic systems include personal computers of all sizes and shapes, such as desktop computers, laptop computers, netbook computers, tablets, web browsers, e-book readers, and personal digital assistants (PDAs). Additional example electronic systems include composite input devices, such as physical keyboards that include input device 100 and separate joysticks or key switches. Further example electronic systems include peripherals such as data input devices (including remote controls and mice), and data output devices (including display screens and printers). Other examples include remote terminals, kiosks, and video game machines (e.g., video game consoles, portable gaming devices, and the like). Other examples include communication devices (including cellular phones, such as smart phones), and media devices (including recorders, editors, and players such as televisions, set-top boxes, music players, digital photo frames, and digital cameras). Additionally, the electronic system could be a host or a slave to the input device.

The input device 100 can be implemented as a physical part of the electronic system, or can be physically separate from the electronic system. As appropriate, the input device 100 may communicate with parts of the electronic system using any one or more of the following: buses, networks, and other wired or wireless interconnections. Examples include, but are not limited to: Inter-Integrated Circuit ($I^2C$), Serial Peripheral Interface (SPI), Personal System 2 (PS/2), Universal Serial Bus (USB), Bluetooth, Radio Frequency (RF), and Infrared Data Association (IrDA).

In FIG. 1, the input device 100 is shown as a proximity sensor device (also often referred to as a "touchpad" or a "touch sensor device") configured to sense input provided by one or more input objects 140 in a sensing region 120. Example input objects include fingers and styli, as shown in FIG. 1.

Sensing region 120 encompasses any space above, around, in and/or near the input device 100 in which the input device 100 is able to detect user input (e.g., user input provided by one or more input objects 140). The sizes, shapes, and locations of particular sensing regions may vary widely from embodiment to embodiment. In some embodiments, the sensing region 120 extends from a surface of the input device 100 in one or more directions into space until signal-to-noise ratios prevent sufficiently accurate object detection. The distance to which this sensing region 120 extends in a particular direction, in various embodiments, may be on the order of less than a millimeter, millimeters, centimeters, or more, and may vary significantly with the type of sensing technology used and the accuracy desired. Thus, some embodiments sense input that comprises no contact with any surfaces of the input device 100, contact with an input surface (e.g., a touch surface) of the input device 100, contact with an input surface of the input device 100 coupled with some amount of applied force or pressure, and/or a combination thereof. In various embodiments, input surfaces may be provided by surfaces of casings within which the sensor electrodes reside, by face sheets applied over the sensor electrodes or any casings, etc. In some embodiments, the sensing region 120 has a rectangular shape when projected onto an input surface of the input device 100.

The input device 100 may utilize any combination of sensor components and sensing technologies to detect user input in the sensing region 120. The input device 100 comprises one or more sensing elements for detecting user input. As several non-limiting examples, the input device 100 may use acoustic, ultrasonic, capacitive, elastive, resistive, inductive, and/or optical techniques.

Some implementations are configured to provide images that span one, two, three, or higher dimensional spaces. Some implementations are configured to provide projections of input along particular axes or planes.

In some capacitive implementations of the input device 100, voltage or current is applied to create an electric field. Nearby input objects cause changes in the electric field, and produce detectable changes in capacitive coupling that may be detected as changes in voltage, current, or the like.

Some capacitive implementations utilize arrays or other regular or irregular patterns of capacitive sensing elements to create electric fields. In some capacitive implementations, separate sensing elements may be ohmically shorted together to form larger sensor electrodes. Some capacitive implementations utilize resistive sheets, which may be uniformly resistive.

Some capacitive implementations utilize "mutual capacitance" (or "transcapacitance") sensing methods based on changes in the capacitive coupling between sensor electrodes. In various embodiments, an input object near the sensor electrodes alters the electric field between the sensor electrodes, thus changing the measured capacitive coupling. In one implementation, a transcapacitive sensing method operates by detecting the capacitive coupling between one or more transmitter sensor electrodes (also "transmitter electrodes" or "transmitters") and one or more receiver sensor electrodes (also "receiver electrodes" or "receivers"). Transmitter sensor electrodes may be modulated relative to a reference voltage (e.g., system ground) to transmit transmitter signals, and receiving sensor electrodes may be held substantially constant relative to the reference voltage to facilitate receipt of resulting signals. The resulting signals may comprise one or more responses, each response corresponding to one of the transmitter signals. Sensor electrodes may be dedicated transmitter electrodes or receiver electrodes, or may be configured to both transmit and receive.

In FIG. 1, a processing system (or "processor") 110 is shown as part of the input device 100. The processing system 110 is configured to operate the hardware of the input device 100 to detect input in the sensing region 120. The processing system 110 comprises parts of or all of one or more integrated circuits (ICs) and/or other circuitry components; in some embodiments, the processing system 110 also comprises electronically-readable instructions, such as firmware code, software code, and/or the like. In some embodiments, components composing the processing system 110 are located together, such as near sensing element(s) of the input device 100. In other embodiments, components of processing system 110 are physically separate with one or more components close to sensing element(s) of input device 100, and one or more components elsewhere. For example, the input device 100 may be a peripheral coupled to a desktop computer, and the processing system 110 may comprise software configured to run on a central processing unit of the desktop computer and one or more ICs (perhaps with associated firmware) separate from the central processing unit. As another example, the input device 100 may be physically integrated in a phone, and the processing system 110 may comprise circuits and firmware that are part of a main processor of the phone. In some embodiments, the processing system 110 is dedicated to implementing the input device 100. In other embodiments, the processing system 110 also performs other functions, such as operating display screens, driving haptic actuators, etc.

The processing system 110 may be implemented as a set of modules that handle different functions of the processing system 110. Each module may comprise circuitry that is a part of the processing system 110, firmware, software, or a combination thereof. In various embodiments, different combinations of modules may be used. Example modules include hardware operation modules for operating hardware such as sensor electrodes and display screens, data processing modules for processing data such as sensor signals and positional information, and reporting modules for reporting information. Further example modules include sensor operation modules configured to operate sensing element(s) to detect input, identification modules configured to identify gestures such as mode changing gestures, and mode changing modules for changing operation modes.

In some embodiments, the processing system 110 responds to user input (or lack of user input) in the sensing region 120 directly by causing one or more actions. Example actions include changing operation modes, as well as GUI actions such as cursor movement, selection, menu navigation, and other functions. In some embodiments, the processing system 110 provides information about the input (or lack of input) to some part of the electronic system (e.g., to a central processing system of the electronic system that is separate from the processing system 110, if such a separate central processing system exists). In some embodiments, some part of the electronic system processes information received from the processing system 110 to act on user input, such as to facilitate a full range of actions, including mode changing actions and GUI actions.

For example, in some embodiments, the processing system 110 operates the sensing element(s) of the input device 100 to produce electrical signals indicative of input (or lack of input) in the sensing region 120. The processing system 110 may perform any appropriate amount of processing on the electrical signals in producing the information provided to the electronic system. For example, the processing system 110 may digitize analog electrical signals obtained from the sensor electrodes. As another example, the processing system 110 may perform filtering or other signal conditioning. As yet another example, the processing system 110 may subtract or otherwise account for a baseline, such that the information reflects a difference between the electrical signals and the baseline. As yet further examples, the processing system 110 may determine positional information, recognize inputs as commands, recognize handwriting, and the like.

"Positional information" as used herein broadly encompasses absolute position, relative position, velocity, acceleration, and other types of spatial information. Exemplary "zero-dimensional" positional information includes near/far or contact/no contact information. Exemplary "one-dimensional" positional information includes positions along an axis. Exemplary "two-dimensional" positional information includes motions in a plane. Exemplary "three-dimensional" positional information includes instantaneous or average velocities in space. Further examples include other representations of spatial information. Historical data regarding one or more types of positional information may also be determined and/or stored, including, for example, historical data that tracks position, motion, or instantaneous velocity over time.

In some embodiments, the input device 100 is implemented with additional input components that are operated by the processing system 110 or by some other processing system. These additional input components may provide redundant functionality for input in the sensing region 120, or some other functionality. FIG. 1 shows buttons 130 near the sensing region 120 that can be used to facilitate selection of items using the input device 100. Other types of additional input components include sliders, balls, wheels, switches, and the like. Conversely, in some embodiments, the input device 100 may be implemented with no other input components.

In some embodiments, the input device 100 comprises a touch screen interface, and the sensing region 120 overlaps at least part of an active area of a display screen. For example, the input device 100 may comprise substantially transparent sensor electrodes overlaying the display screen and provide a touch screen interface for the associated electronic system. The display screen may be any type of dynamic display capable of displaying a visual interface to a user, and may include any type of light emitting diode (LED), organic LED (OLED), cathode ray tube (CRT), liquid crystal display (LCD), plasma, electroluminescence (EL), or other display technology. The input device 100 and the display screen may share physical elements. For example, some embodiments may utilize some of the same electrical components for displaying and sensing. As another example, the display screen may be operated in part or in total by the processing system 110.

It should be understood that while many embodiments of the invention are described in the context of a fully functioning apparatus, the mechanisms of the present invention are capable of being distributed as a program product (e.g., software) in a variety of forms. For example, the mechanisms of the present invention may be implemented and distributed as a software program on information bearing media that are readable by electronic processors (e.g., non-transitory computer-readable and/or recordable/writable information bearing media readable by the processing system 110). Additionally, the embodiments of the present invention apply equally regardless of the particular type of medium used to carry out the distribution. Examples of non-transitory, electronically readable media include various discs, memory sticks, memory cards, memory modules, and the like. Electronically readable media may be based on flash, optical, magnetic, holographic, or any other storage technology.

Glossary of Terms

The following Glossary of Terms is provided to define terms which are used herein. In addition to this Glossary of Terms, numerous Figures are provided and described below in order to further illustrate and provide an understanding of these and other terms used herein.

An "ohmic seam" is a break that provides an ohmic disconnect (a direct current open) between separated sensor electrodes, and is often substantially perpendicular to an alignment axis of the separated sensor electrodes. ("Substantially perpendicular" is used here to include exactly perpendicular). For example, a "transmitter seam" is an ohmic seam that separates sets of transmitter electrodes, and the transmitter seam is often substantially perpendicular to an axis along which the separated transmitter electrodes are aligned. Similarly, a "receiver seam" is an ohmic seam that separates sets of receiver electrodes, and the receiver seam is often substantially perpendicular to an axis along which the separated receiver electrodes are aligned. An ohmic seam typically sections the sensor pattern in such a way that at least some of the transmitter electrodes and receiver electrodes in each section is wholly within their respective sections. As discussed further below, an ohmic seam may or may not overlap a sensor electrode.

An ohmic seam may overlap and run along a sensor electrode that is not separated by that ohmic seam. For example, a transmitter seam may run along a multi-section receiver electrode that is electrically continuous across the transmitter seam, such that this multi-section receiver electrode belongs to multiple sections. The analogous is true for receiver seams and transmitter electrodes. This arrangement typically creates split pixels (discussed below).

"Pitch" describes the spacing between sensor electrodes of a particular type (e.g., transmitter electrodes or receiver electrodes). Pitch can be measured as a distance from center-to-center of adjacent sensor electrodes of the same type.

"Opposite sensor electrodes" are substantially collinear sensor electrodes of the same type which are disposed on different sides of an ohmic seam. "Opposite transmitter electrodes" are transmitter electrodes which oppose one another across a transmitter seam, and "opposite receiver electrodes" are receiver electrodes which oppose one another across a receiver seam. Opposite sensor electrodes may have sensor electrodes of another type or have conductive material that do not form sensor electrodes (e.g., conductive shields, routing lines, etc.) disposed between them. For example, opposite transmitter electrodes may have receiver electrode(s) and/or conductive strips held at system ground between them. Opposite sensor electrodes may be slightly offset and not truly collinear, as long as they are at least partially collinear.

"Adjacent sensor electrodes" are substantially parallel, non-collinear sensor electrodes which have no other substantially parallel sensor electrode of that type (e.g., another transmitter electrode or another receiver electrode) disposed between them. Adjacent sensor electrodes may have sensor electrodes, of another type or conductive material, that do not form sensor electrodes (e.g., conductive shields, routing lines, etc.) disposed between them. Adjacent sensor electrodes may be in the same section of a sensor pattern, or be separated by a seam and be in different sections. Opposite sensor electrodes are not considered adjacent sensor electrodes, even if they are offset from each other such that they are non-collinear.

"Pixel" is used to describe sensor pixels defined by the sensor pattern and sensing scheme. A transcapacitive sensor electrode layout defines spaces of localized capacitive coupling between transmitter and receiver electrodes, where the strength of that capacitive coupling varies measurably with the proximity of input objects. Those spaces of localized capacitive coupling are pixels of the transcapacitive sensor, and the change in the strength of capacitive coupling may be measured as a change in capacitance. Pixels are often associated with intersections between transmitter and receiver electrodes. "Intersection" is used herein to include overlap without true contact. A transmitter electrode can be capacitively coupled with more than one receiver electrode at a pixel, and a receiver electrode can be capacitively coupled with more than one transmitter electrode at a pixel.

An "undivided pixel" is a pixel where the localized capacitive coupling is dominated by the capacitive coupling of a single transmitter electrode with a single receiver electrode.

A "split pixel" is a pixel where the localized capacitive coupling is dominated by the capacitive coupling of at least three sensor electrodes (e.g., two opposite transmitter electrodes and one receiver electrode, two opposite receiver electrodes and one transmitter electrode, or some other number and arrangement of transmitter and receiver electrodes). Split pixels may be found at some ohmic seams.

A "partial pixel" is a part of a split pixel that is associated with a subset of the sensor electrodes that form the split pixel. This subset capacitively couple with each other in a substantive way.

A "frame" is a snapshot of detected input (or lack thereof) in the entire sensing region. With a transcapacitive sensor, a frame may be composed of measurements of the change in capacitance of the pixels. These measurements may be direct measurements of the capacitance, or may be measurements of surrogates (e.g., voltage, current, charge, etc.).

The "frame period" is the time it takes to scan an entire sensing region of a transcapacitive sensing input device. A frame period may be divided into separate time intervals. The "frame rate" (also "frame frequency") is the inverse of frame period. The frame period and frame rate depends on factors such as how many transmitter electrodes there are and how long it takes to scan each transmitter. Many applications require frame rates above certain minimum rates.

Example Sensor Patterns with Ohmic Seams

Sensor patterns described herein are sectioned by ohmic seams between sensor electrodes. These ohmic seams provide smaller sections that can enable improved performance as compared to a sensor patterns without ohmic seams. That is, the sensor pattern is divided into multiple sections with sensor electrodes that are shorter than if the pattern were not divided. This sectioned approach may enable better performance such as faster frame rates, decreased susceptibility to noise, and the like, when compared to an unsectioned sensor pattern. Also, the scanning of these smaller sections can be synchronized and sequenced in such a way as to avoid or reduce imaging artifacts associated with the ohmic seam(s). It is appreciated that any of the sensor patterns described herein may be utilized to implement any appropriate sensing region of any appropriate input device, including sensing region 120 of input device 100.

Figure 2:
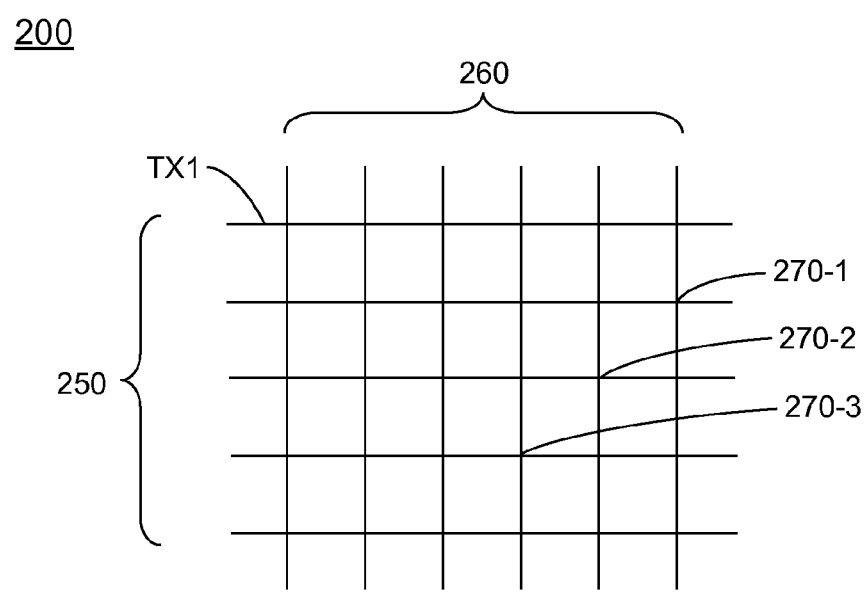
FIG. 2 shows a portion of an example capacitive sensor pattern which may be used to implement a sensing region, according to an embodiment.

FIG. 2 shows a portion of an example capacitive sensor pattern 200 which may be used to implement a sensing region (e.g., sensing region 120), according to an embodiment. Capacitive sensor pattern 200 is used to introduce some aspects that are generally applicable to all embodiments described herein. Specifically, capacitive sensor pattern 200 is for a transcapacitive input device and may be used to detect changes in mutual capacitive coupling between a plurality of transmitter electrodes 250 and a plurality of receiver electrodes 260. The plurality of transmitter electrodes 250 overlap with and the plurality of receiver electrodes 260 at a grid of intersections 270 (three intersections 270-1, 270-2, and 270-3 are labeled in FIG. 2).

In sensor pattern 200, the pluralities of transmitter and receiver electrodes 250, 260 are aligned horizontally and vertically, respectively. Other embodiments may align them in some other manner. For example, various embodiments may have overall sensor electrode alignment directions that are rotated from that of sensor pattern 200. As another example, various embodiments may have different angles between their sensor electrodes than that of sensor pattern 200; that is, pairs of transmitter electrodes 250 or receiver electrodes 260 may not be parallel, and/or the plurality of transmitter electrodes 250 may not be aligned orthogonally to the plurality of receiver electrodes 260. As a further example, various embodiments may have overall alignment directions that are rotated from that of sensor pattern 200 and different angles between their sensor electrodes.

These pluralities of transmitter and receiver electrodes 250, 260 are shown as thin lines in FIG. 2, and they may be of any appropriate physical shape in actuality. For example, various sensor electrodes may be composed of entirely linear portions, entirely nonlinear portions, or a combination of linear and nonlinear portions. As another example, various sensor electrodes may have multiple parallel sections arranged as tines or loops, multiple polygons linked in series, etc. Various figures in this application depict sensor electrodes that are simple rectangles, linked rectangles, and slotted rectangles. These shapes are used for convenience, and generally simple rectangles are used to provide simpler figures for discussion.

The pluralities of transmitter and receiver electrodes 250, 260 may be formed of any appropriate stack-up of material. In some embodiments, the pluralities of transmitter and receiver electrodes 250, 260 are disposed on completely different conductive layers of material. For example, the plurality of transmitter electrodes 250 may be entirely formed in a first layer of conductive material, the plurality of receiver electrodes 260 may be entirely formed in a second layer of conductive material, and a dielectric material may separate these first and second layers. As another example, the plurality of transmitter electrodes 250 (or the plurality of receiver electrodes 260) may be formed from multiple layers of conductive material.

In some embodiments, the pluralities of transmitter and receiver electrodes 250, 260 do share one or more conductive layers of material. For example, the plurality of transmitter electrodes 250 may be entirely formed in a first layer of conductive material, and the plurality of receiver electrodes 260 may be partially formed in the first layer of conductive material and partially formed in a second layer of conductive material. The first layer may contain distinct sensor elements of the plurality of receiver electrodes 260, and the second layer may contain conductive jumpers that connect select sensor elements into complete receiver electrodes, or vice versa. Dielectric material may separate the jumpers from shorting with the plurality of transmitter electrodes 250 where the jumpers intersect with that plurality. As another example, the plurality of transmitter electrodes 250 may be partially formed in a first layer of conductive material and partially formed in a second layer of conductive material, and the plurality of receiver electrodes 260 may be entirely formed in the second layer of conductive material. In various other examples, the plurality of transmitter electrodes 250 (or the plurality of receiver electrodes 260) may be formed from more layers of conductive material.

The sensor pattern may be designed such that the plurality of receiver electrodes 260 is closer than the plurality of transmitter electrodes 250 to where input objects are likely to be. For example, the plurality of receiver electrodes 260 may be closer to an associated input surface.

The sensor pattern 200 may be physically implemented with any appropriate materials. For example, the sensor electrodes may be formed of copper disposed in one or more layers of a FR4-type fiberglass reinforced epoxy laminated PCB. As other examples, the sensor electrodes may be formed of other conductive materials, such as conductive ink (e.g., carbon ink, silver ink), ITO (indium tin oxide), conductive nano-particles, metal mesh, etc. Also, the sensor electrodes may be disposed on an appropriate insulative material(s), such as glass, polyimide, polyester (e.g., PET, or polyethylene terephthalate), among others.

Not shown in FIG. 2, transmitter electrodes 250 and receiver electrodes 260 are coupled with sensing circuitry (transmitter circuitry and receiver circuitry, respectively) of a processing system such as processing system 110. In some embodiments, one or more of the transmitter electrodes may be coupled to transmitter circuitry at multiple locations. For example, TX1 may be coupled with sensing circuitry on its first end and also on its second end; these couplings may allow charge to be placed on TX1 more quickly than if TX1 was charged from only one end.

In FIG. 2, the spaces of localized capacitive coupling between transmitter and receiver electrodes are located about their intersections. Thus, the centers of the pixels are located at the intersections of transmitter electrodes and receiver electrodes.

As will be discussed further below, along with alternatives, various embodiments with sectioned sensor patterns may transmit in and scan multiple sections in parallel (concurrently, such that multiple sections will transmit at the same time at least some of the time). This can reduce the number of time intervals during which transmitter electrodes transmit per frame, and increase the frame rate. Some embodiments use sensing schemes that reduce jitter (e.g., in positions detected for input object(s)), detrimental effects from settling, cross-talk from adjacent or opposite transmitter electrodes, etc. For example, in some embodiments, opposite transmitter electrodes may purposely be activated at substantially overlapping time intervals, at partially overlapping time intervals, or at non-overlapping time intervals. As another example, some embodiments coordinate the scanning of two or more sections by coordinating transmitter signals, transmission times, and/or acquisition of resulting signals.

In some embodiments, portions of a processing system (e.g., processing system 110) collect separate values indicative of responses corresponding to transmitter signals from each section, and then centrally processes these centrally as a single larger image. For example, some embodiments comprise processing systems employing multiple ICs; these ICs may scan the sections separately, and provide their results for central processing by a central controller. Depending on the implementation, the central controller may be able to process the results as if they were obtained from a single large section.

Further, some embodiments are physically configured to reduce measurement artifacts that may occur near the ohmic seams. For example, some embodiments comprise seams designed such that the change in capacitance due to an input object is substantially the same for a pixel near an ohmic seam and for a pixel away from any ohmic seams (e.g., in the inner portion of each section). As another example, some embodiments use regular pitches and symmetric dimensions throughout the sensor pattern—near, away from, or at an ohmic seam. As yet another example, some embodiments use sensor patterns with small gaps between transmitter electrodes at transmitter seams, and/or with small gaps between receiver electrodes at receiver seams.

Figure 3:
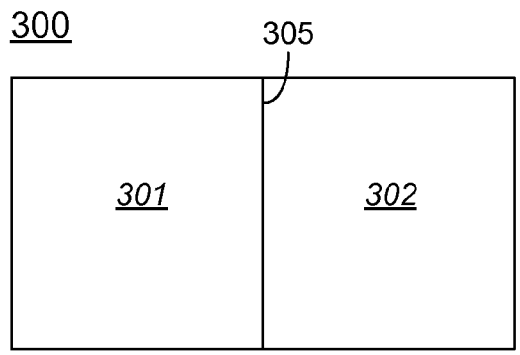
FIG. 3 shows an example sensor pattern that has been divided into two sections by an ohmic seam, according to an embodiment.
Figure 4:
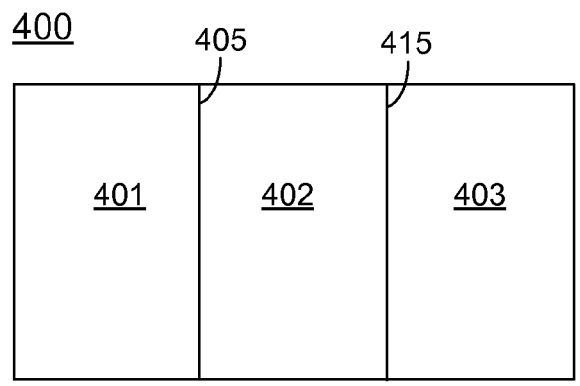
FIG. 4 shows an example sensor pattern that has been divided into three sections by two non-intersecting ohmic seams, according to an embodiment.
Figure 5:
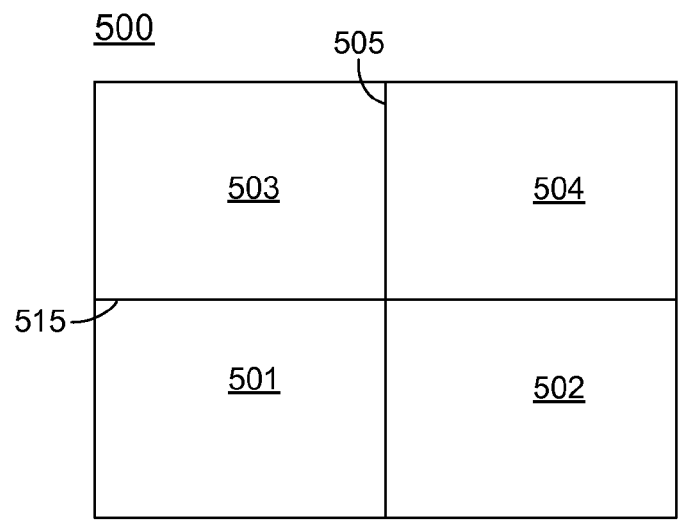
FIG. 5 shows an example sensor pattern that has been divided into four sections by two intersecting ohmic seams, according to an embodiment.

FIGS. 3-5 illustrate several examples of how a sensor pattern may be divided into smaller sections by ohmic seams, according to various embodiments. FIG. 3 shows a sensor pattern 300 that has been divided into two sections 301, 302 (halves are shown), by ohmic seam 305. FIG. 4 shows a sensor pattern 400 that has been divided into three sections 401, 402, 403 (thirds are shown) by ohmic seams 405 and 415. FIG. 5 shows a sensor pattern 500 that has been divided into four sections 501, 502, 503, 504 (fourths are shown) by perpendicularly intersecting ohmic seams 505 and 515. Other embodiments may have sensor patterns with other numbers and arrangements of ohmic seams and sections. For example, an embodiments may have six sections divided by one transmitter seam and two receiver seams.

FIGS. 3-5 provide only three examples. It should be appreciated that any number of sections is permissible, and that sections may be of different shapes and/or sizes. In some embodiments, the ohmic seams may or may not correspond to physical breaks in some of the sensor electrodes. For example, a transmitter electrode may lie on both sides of a receiver seam, and a receiver electrode may lie on both sides of a transmitter seam. This arrangement generally creates, along the ohmic seams, split pixels comprised of partial pixels. Split pixels are further described in conjunction with description of FIG. 8 and FIG. 9.

Figure 6:
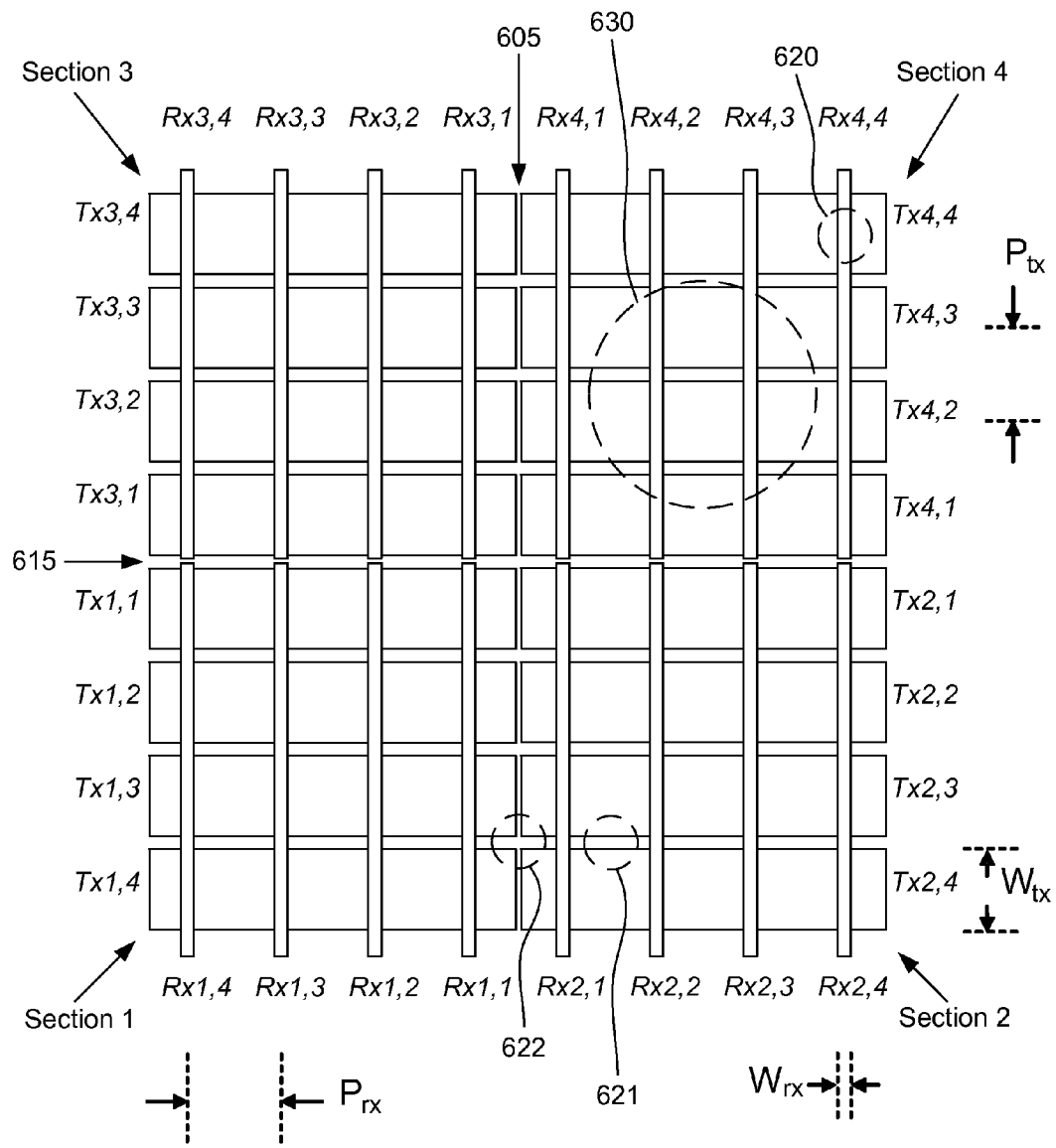
FIG. 6 shows the layout of an example four-section sensor pattern with sensor electrodes that are simple rectangles in shape, according to an embodiment.

FIG. 6 shows the layout of an example four-section sensor pattern 600 with sensor electrodes that are simple rectangles in shape. Transmitter electrodes (TX) may be formed entirely in a first layer, receiver electrodes (RX) may be formed entirely in a second layer, and these layers are separated by a dielectric material. Transmitter seam 605 separates sensor electrodes of sections 1 and 3 from the sensor electrodes of sections 2 and 4, and provides an ohmic break between the transmitter electrodes (TX) of those sections. Receiver seam 615 separates sensor electrodes of sections 1 and 2 from the sensor electrodes of sections 3 and 4, and provides an ohmic break between the receiver electrodes (RX) of those sections. Together, the transmitter and receiver seams 605, 615 physically separate the transmitter electrodes and receiver electrodes in each of the four sections (1, 2, 3, 4) from the transmitter and receiver electrodes in the other sections. Transmitter seam 605 sections adjacent receiver electrodes RX3,1 and RX4,1 (and also RX1,1, and RX2,1) and separates opposite transmitter electrodes. Receiver seam 615 sections adjacent transmitter electrodes TX3,1 and TX1,1 (and TX4,1 and TX2,1) and separates opposite receiver electrodes. Separate transmitter electrodes are labeled TXi,j and separate receiver electrodes are labeled RXi,j where i represents the sensor section and j numbers the sensor electrode within the section. The section and sensor electrode numbering are arbitrary. This TX, RX, i, and j notations and numbering schemes are utilized in other sensor patterns described herein in similar ways.

Circle 620 represents a pixel centered at the intersection of TX4,4 and RX4,4. (With other sensor electrode shapes or layouts, the pixels may not be centered at the intersections of transmitter and receiver electrodes). The circles, ovals, other indicators used herein to represent pixels are meant to locate those pixels, and not meant to show the space of that pixel. For example, circle 620 is meant to locate that pixel in FIG. 6, and is not meant to be coextensive with the space of that pixel. Circles 621 and 622 do not represent pixels as they are not centered at the center of localized spaces of capacitive coupling between transmitter and receiver electrodes in this example. Circle 630 represents an example area associated with a finger touch to the sensor pattern 600 (often realized as a touch to an associated input surface disposed over the sensor pattern 600). As can be seen, a finger touch to the sensor pattern 600 will typically affect the capacitive responses of several pixels.

$P_{TX}$ represents the transmitter electrode pitch. $W_{TX}$ represents the effective width of a transmitter electrode. $P_{RX}$ represents the receiver electrode pitch. $W_{RX}$ represents the effective width of a receiver electrode. These four notations are used for analogous measurements in the other Figures. Sensor pattern 600, like the other examples shown in the figures, has a regular transmitter pitch and a regular receiver pitch. However, other embodiments may have variable pitches. Similarly, sensor pattern 600 has transmitter electrodes of the same effective width and receiver electrodes of the same effective width. However, other embodiments may have transmitter electrodes of different widths.

FIG. 6 shows opposite receiver electrodes that oppose one another across a single receiver seam (e.g., RX1,1 and RX3,1 opposite each other across receiver seam 615), and not across multiple receiver seams. Similarly, FIG. 6 shows opposite transmitter electrodes that oppose one another across a single transmitter seam (e.g., TX1,1 and TX2,1 oppose each other across transmitter seam 605), and not across multiple transmitter seams. Although not required, opposite sensor electrodes are often truly collinear with one another as they are in FIG. 6.

FIG. 6 also shows adjacent sensor electrodes. For example, RX3,3 and RX3,4 are adjacent receiver electrodes, and RX3,1 and RX 4,1 are also adjacent receiver electrodes. As another example, TX3,3 and TX3,4 are adjacent transmitter electrodes, and TX1,1 and TX3,1 are also adjacent transmitter electrodes.

FIG. 6 shows both the transmitter and the receiver electrodes physically ending at either type of seam, but this is not required. For example, transmitter electrodes can be physically contiguous across receiver seams. As another example, receiver electrodes can be physically contiguous across transmitter seams. Such contiguous layouts may produce split pixels, which are discussed further below.

FIG. 6 shows an embodiment with both transmitter and receiver seams. However, embodiments need not have both transmitter and receiver seams. That is, some embodiments have transmitter seam(s) only, some embodiments have receiver seam(s) only, and some embodiments have both transmitter seam(s) and receiver seam(s).

Figure 7:
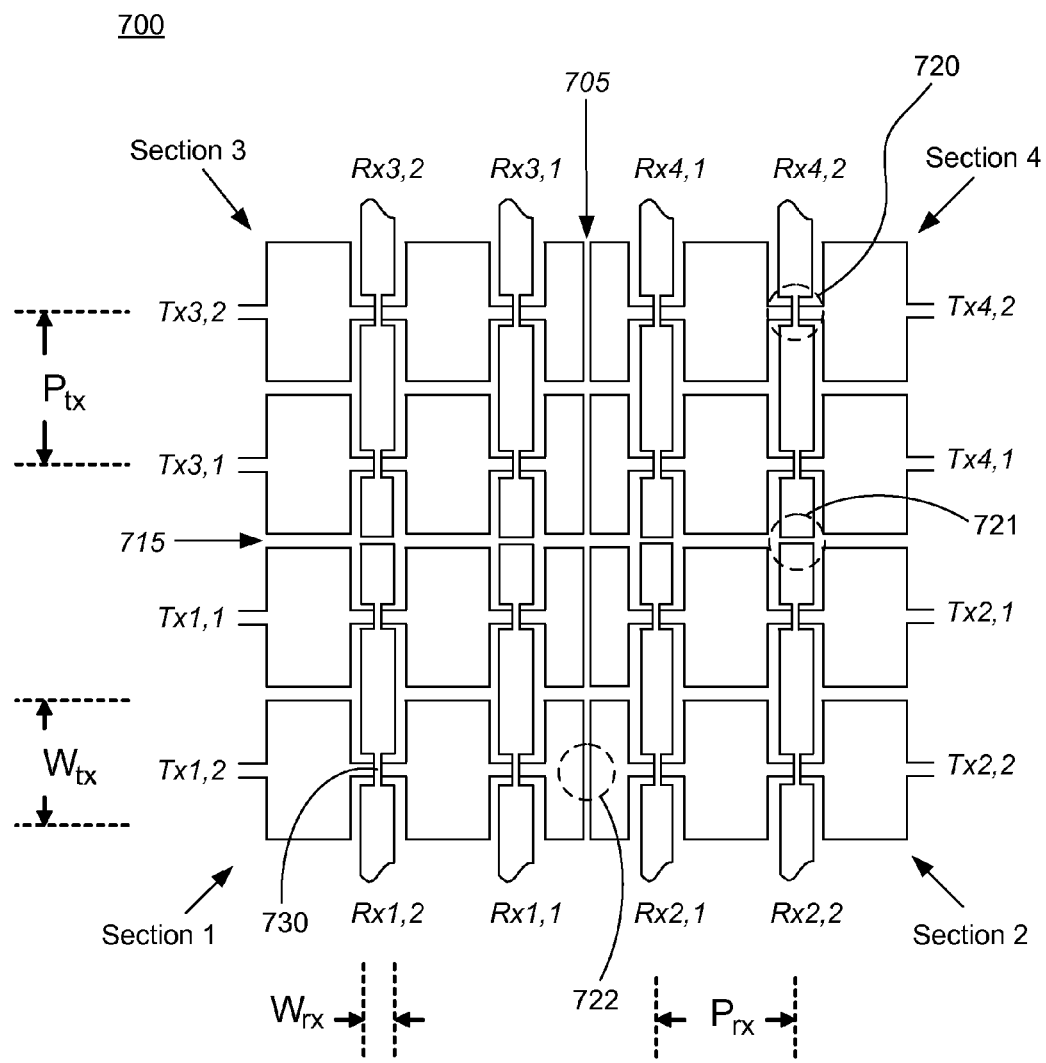
FIG. 7 shows a layout of an example four-section sensor electrode sensor pattern with sensor electrodes that are not merely simple rectangles in shape, according to an embodiment.

FIG. 7 shows a layout of an example four-section sensor electrode sensor pattern 700 with sensor electrodes that are not merely simple rectangles in shape, according to an embodiment. In sensor pattern 700, entire transmitter electrodes (TX) are disposed in a first layer of conductive material. Also disposed in the first layer of material are sensor elements of receiver electrodes (RX). These sensor elements are connected by conductive jumpers 730 (one jumper 730 is labeled in FIG. 7) disposed in a second layer of conductive material. The jumpers are separated from the transmitter electrodes by dielectric material (not shown).

Ohmic seam 705 is a transmitter seam and ohmic seam 715 is a receiver seam. Transmitter seam 705 separates the sensor electrodes of sections 1 and 3 from the sensor electrodes of sections 2 and 4, and provides an ohmic break between the receiver electrodes in those sections. Receiver seam 715 separates sensor electrodes of sections 3 and 4 from the sensor electrodes of sections 1 and 2, and provides an ohmic break between the receiver electrodes in those sections. Receiver seam 715 runs between TX1,1 and TX3,1, and between TX2,1 and TX4,1. Transmitter seam 705 runs between RX1,1 and RX2,1, and between RX3,1 and RX 4,1. Note that sensor pattern 700 does not have split pixels.

As illustrated by FIG. 7 and as also discussed above with FIG. 2, many other types of sensor patterns and sensor electrode shapes are contemplated with the embodiments described herein. In the sensor pattern 700, the transmitter and receiver electrodes are designed to be thinner at intersections, and have reduced overlap compared to if they were not thinner at those intersections.

A pixel in sensor pattern 700 is located by circle 720, and is centered about the intersection of TX4,2 and RX4,2. Circles 721 and 722 seem to locate centers of other pixels are first glance, but they do not. That is, although multiple sensor electrodes are near each other at circles 721 and 722, these circles 721 and 722 do not locate centers of spaces of localized capacitive coupling between transmitter and receiver electrodes. Instead, circle 721 is located between the centers of actual pixels: a first nearby pixel is located at the intersection of TX4,1 and RX4,2, and a second nearby pixel located at the intersection of TX2,1 and RX2,2. Similarly, circle 722 is located between the centers of actual pixels: a first nearby pixel is located at the intersection of TX1,2 and RX1,1 and a second nearby pixel is located at the intersection of TX2,2, and RX2,1.

Figure 8:
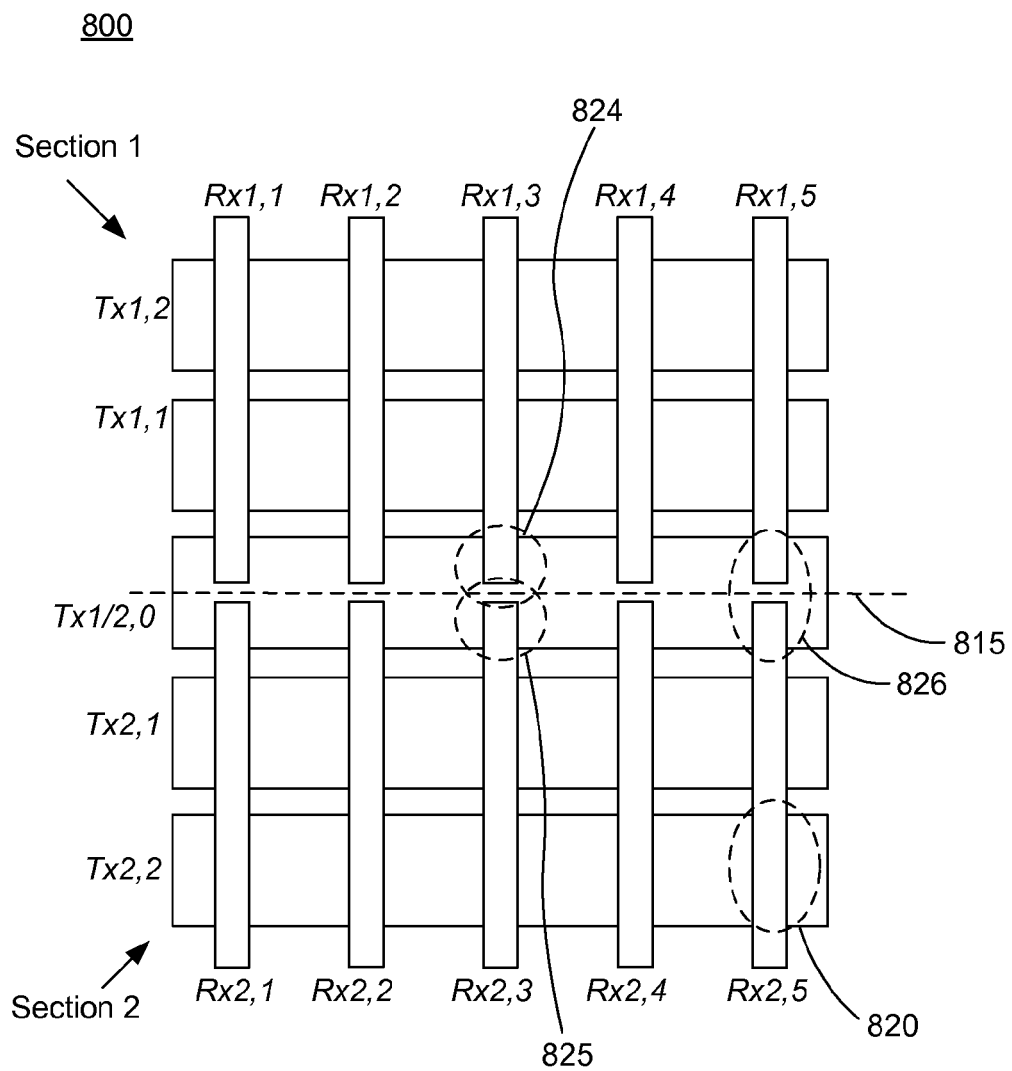
FIGS. 8 and 9 illustrate two examples of a sensor patterns with spit pixels, according to various embodiments.
Figure 9:
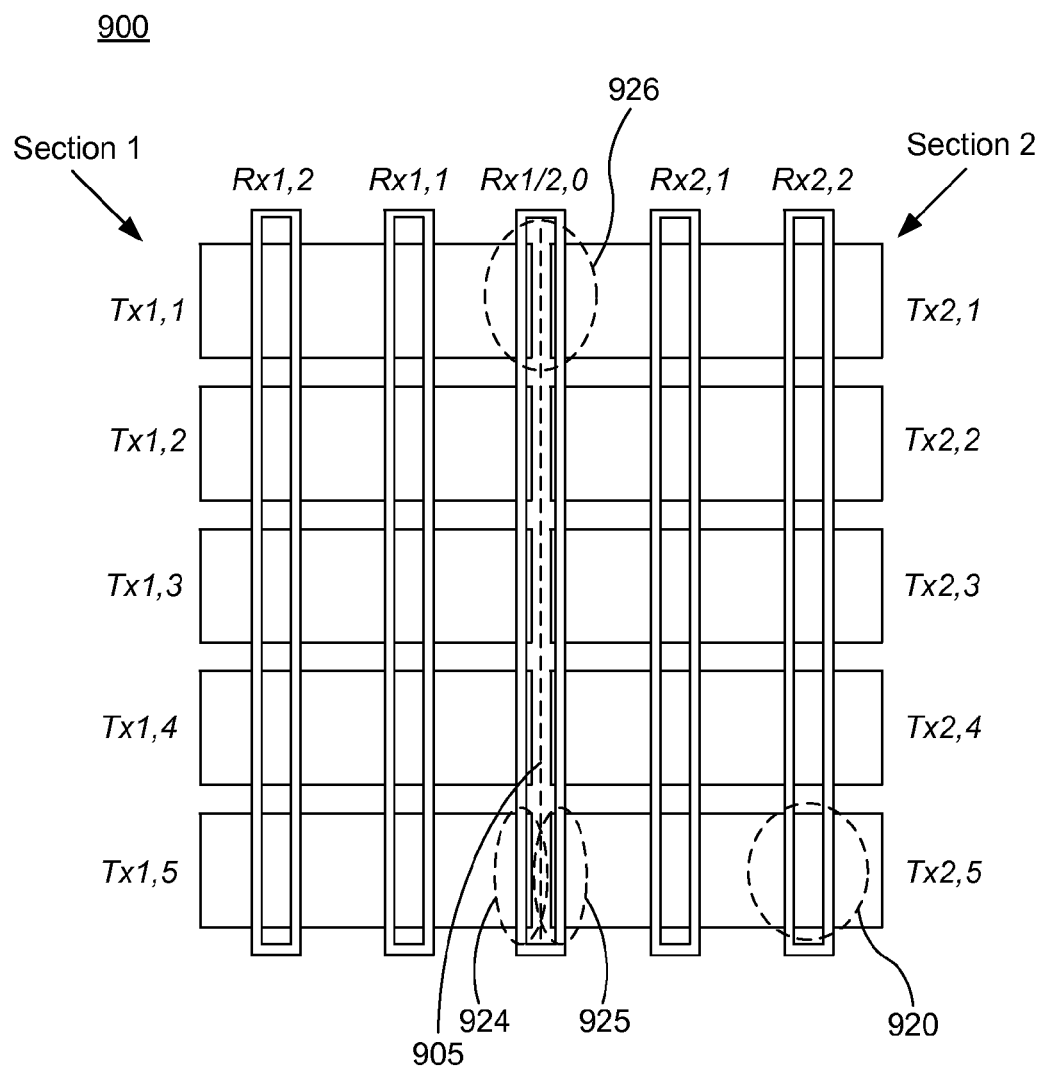

FIGS. 8-9 illustrate example sensor patterns 800, 900 with split pixels, in accordance with some embodiments. Specifically, in each sensor pattern 800, 900, there is at least one ohmic seam that overlaps with a sensor electrode; thus, the respective pluralities of transmitter electrodes and receiver electrodes form a plurality of split pixels coinciding with this at least one ohmic seam. FIGS. 8 and 9 both depict split pixels formed from three sensor electrodes each (one transmitter electrode and two receiver electrodes for sensor pattern 800, and two transmitter electrodes and one receiver electrodes for sensor pattern 900). However, other sensor patterns may have split pixels formed with other numbers and ratios of transmitter or receiver electrodes. Similarly, FIGS. 8 and 9 both depict split pixels formed from two partial pixels each. Other sensor patterns may have split pixels formed from other numbers of partial pixels.

The total response at a split pixel may be determined as a combination of the responses at the partial pixels. For example, in one embodiment, the total response is computed as a simple sum of the responses of the partial pixels from which it is constituted. As another example, in one embodiment, the total response at a split pixel is computed as a scaled and/or weighted sum of the partial pixel responses. That is, a scaling and/or weighting is applied to at least one partial pixel that differs from the weight (considered one if not changed) of at least one other pixel. This scaling or weighting may be based on an amount of signal amplification associated with said at least one partial pixel, on a configuration of the sensor electrodes forming the partial pixel, etc.

The scaling or weighting associated with the partial pixels may be determined at design, at manufacture, or after manufacturing (e.g., during operation). For example, the capacitive interactions of the sensor electrodes and input objects may be modeled during design. As another example, the responses of the split pixels of a sensor device may be measured during manufacture. As a further example, the responses of the split pixels may be measured in the field, during operation. Appropriate weights assigned to the partial pixels may be stored in a memory or some other portion of an associated processing system (see e.g., memory 1525 of processing system 1510, shown in FIG. 15).

FIG. 8 illustrates an example of a sensor pattern 800 that is divided into two sections (section 1, section 2) by a receiver seam 815, according to an embodiment. Receiver seam 815 overlaps and runs along a transmitter electrode TX1/2,0 that does not have an ohmic disconnect at the receiver seam 815. That is, receiver seam 815 does not divide TX1/2,0 ohmically. The notation TX1/2,0 indicates that it is contiguous across receiver seam 815, and is partially in section 1 and partially in section 2. Sensor pattern 800 illustrates a sensor pattern which includes undivided pixels such as undivided pixel 820 and split pixels such as split pixel 826. Undivided pixel 820 is located at the intersection of TX2,2 and RX2,5. The split pixels of pattern 800 each consists of a space of localized capacitive coupling dominated by three sensor electrodes—one transmitter electrode (TX1/2,0) and two receiver electrodes. For example, split pixel 826 is made up of two partial pixels—one located at the intersection of TX1/2,0 and RX1,5 and one located at the intersection of TX1/2,0 and RX2,5.

FIG. 9 illustrates an example of a sensor pattern 900 that is divided into two sections (section 1, section 2) by a transmitter seam 905, according to an embodiment. In FIG. 9, each of the receiver electrodes (e.g., RX1,1) is composed of multiple parallel sections. Specifically, the receiver electrodes are each composes of two parallel sections connected at both ends to each other, and has the general shape of a slotted rectangle. Transmitter seam 905 overlaps and runs along a receiver electrode RX1/2,0 that does not have an ohmic disconnect at the ohmic seam. That is, transmitter seam 905 does not divide RX1/2,0 ohmically. The notation of RX1/2,0 indicates that receiver electrode RX1/2,0 is partially in section 1 and partially in section 2.

Sensor pattern 900 includes undivided pixels (e.g., circle 920 represents an undivided pixel) and split pixels (e.g., circle 926 represents a split pixel). The split pixels are formed from partial pixels, such as partial pixels represented by circle 924 located at the intersection of TX1,5 and RX1/2,0 and circle 925 located at the intersection of TX2,5 and RX1/2,0. In sensor pattern 900, each of the split pixels consists of a space of localized capacitive coupling dominated by three sensor electrodes—one receiver electrode (RX1/2,0) and two transmitter electrodes. For example, split pixel 926 is made up of two partial pixels located at the intersection of RX1/2,0 and TX1,1 and at the intersection of RX1/2,0 and TX2,1.

As illustrated by the above described sensor patterns, various embodiments have various sensor pattern layouts and sensor pattern shapes. It should also be reiterated that various embodiments may differ from those illustrated herein. For example, in some embodiments, transmitter seams (or receiver seams) are not perpendicular to an alignment direction of the transmitter electrodes (or receiver electrodes) that they divide. As another example, some embodiments have straight transmitter electrodes that run vertically through the sensor pattern and straight receiver electrodes that run horizontally through the sensor pattern with the transmitter and receiver electrodes arranged substantially perpendicular relative to one another. Similarly, some embodiments have straight transmitter electrodes that run horizontally and straight receiver electrodes that run vertically with the transmitter and sensor electrodes arranged substantially orthogonally relative to one another. As a further example, sensor electrodes may be of any appropriate shape, and a single sensor pattern may employ transmitter electrodes (or receiver electrodes) or different shapes and sizes. These sensor electrodes may be non-linear in part (piecewise linear) or in whole (never linear), may not be parallel to other sensor electrodes of the same type or perpendicular to sensor electrodes of a different type, or differ in other respects from what is depicted in the Figures.

Many other variations are possible and contemplated. For example, ohmic seams may not extend across the entire sensor pattern. As a specific example, a sensor pattern with a receiver seam may have receiver electrodes that extend partway across the sensor pattern to oppose each other at that receiver seam; this sensor pattern may also have other receiver electrodes that extend across the entire sensor pattern and not intersect the receiver seam. The converse is also true for sensor patterns with transmitter seams that extend partially across those sensor patterns.

As another example, sensor patterns may have asymmetric sections. The sections may differ in the number of sensor electrodes, the sizes of sensor electrodes, the pitch of the sensor electrodes, and the like. As a specific example, a sensor pattern with an odd number of transmitter electrodes and a receiver seam may locate the receiver seam between transmitter electrodes (which would result in no split pixels at the receiver seam) instead of over the transmitter electrode (which would likely result in split pixels at the receiver seam).

Sensing Schemes

To scan sections and obtain frames of input information, the transmitter electrodes are activated to transmit according to an appropriate sensing scheme. Various sensing schemes may be used to scan sectioned sensor patterns, in accordance with various embodiments. For ease of explanation, example sensing schemes discussed here will often refer to FIG. 6 and sensor pattern 600. However, the sensing schemes discussed here may be analogized for and applied to any appropriate sensor pattern with any number of sections. The following discussion also refers to the TXi,j notation introduced earlier, and introduces additional mathematical notation for ease of explanation.

When a transmitter electrode is activated and driven to transmit transmitter signals, it is modulated with a transmitter signal (also "sensing signal"). When a transmitter electrode is not driven to transmit transmitter signals, it is not modulated with a transmitter signal; the transmitter electrode may be held at high impedance (electrically floating) or a constant voltage (such as a reference voltage, system ground, or some other voltage).

The transmission sequence for a section may be described in a mathematical way. During the time interval t which transmitter electrodes transmit do not change (and where: t∈[n,n+1) and n is an integer) an applicable output of a function $M_i(\ )$ may be used to describe which transmitter electrodes (if any) are transmitting in the associated i section during that time interval. For example, for a value n, the output of $M_i(n)=j$ indicates that transmitter TX(i,j) (transmitter j of section i) is transmitting during that time n. For various inputs and $M_i(\ )$, the output may be a scalar, a vector (indicating multiple transmitter electrodes concurrently transmitting in section i), or null (indicating no transmitter electrodes transmitting in section i) during the corresponding time intervals. For simplicity, it is assumed here that the j numbering of sensor electrodes within a section is monotonic (with a possible exception for sensor electrodes that are contiguous across a seam). In this way, $M_i(\ )$ provides a convenient way to express a transmission pattern which maps a then-current time interval n to which transmitter electrodes are transmitting in the i section during that time interval n.

Some embodiments divide their frame periods into uniform time intervals that are equal in time, some embodiments divide their frame periods into non-uniform time intervals, and some embodiments allow the time intervals to be uniform or non-uniform. For example, some embodiments require potential changes to which transmitter electrodes are transmitting to be equally spaced in time, and some embodiments do not impose any such requirements regarding equal or unequal spacing in time. The lengths of the time intervals affect how long the transmitter electrodes transmit.

An embodiment may use a transmission pattern that repeats in a section every frame. This may be described by repeating the same $M_i(\ )$ function for the section(s) for every frame. An embodiment may use a transmission pattern that repeats in a section at a multiple of frames. This may be described by repeating a sequence of different $M_i(\ )$ functions for the section. An embodiment may use an aperiodic transmission pattern that does not repeat over any multiple of frames. This may be described with a non-repeating sequence of different $M_i(\ )$ functions.

Some embodiments use sensing schemes in which each section has a transmission pattern described by a same $M_i(\ )$ function. That is, $M_i(\ )=$a same $M_0(\ )$ for all i. Transmission patterns are related if they are identical on the same time basis, identical but shifted in time, mirror-symmetric, have other symmetry, and the like. Some embodiments use sensing schemes in which each section has a transmission pattern described by a different $M_i(\ )$ function. That is, no two sections have related transmission patterns. Some embodiments use sensing schemes in which some of the sections have transmission patterns described by a same $M_i(\ )$ function and some of the sections have transmission patterns described by different $M_i(\ )$ functions. That is, some of the sections have related transmission patterns and some of the sections do not have related transmission patterns.

Some embodiments concurrently transmit with transmitter electrodes of different sections. That is, these embodiments scan different sections in parallel by transmitting with different transmitter electrodes in those sections at the same time. In various embodiments, this corresponds to concurrently transmitting a first transmitter signal with a first transmitter electrode disposed on a first side of an ohmic seam, and a second transmitter signal with a second transmitter electrode disposed on a second side of the ohmic seam. The first transmitter signal and the second transmitter signal may be identical or different signals. Where this ohmic seam is a transmitter seam, the first transmitter electrode and the second transmitter electrode may be opposite transmitter electrodes (or be non-opposite transmitter electrodes). Where this ohmic seam is a receiver seam, the first transmitter electrode and second transmitter electrode may not be non-adjacent sensor electrodes (or be adjacent transmitter electrodes).

Transmitter electrodes "concurrently transmit" when they contemporaneously cause resulting signals in receiver electrodes. Thus, concurrently transmitting transmitter electrodes may transmit during a same time period, or during different time periods that overlap with each other. For example, a first transmitter electrode may transmit a first transmitter signal during a first time period and a second transmitter electrode may transmit a second transmitter signal during a second time period. The first and second transmitter electrodes concurrently transmit these first and second transmitter signals if the first and second time periods at least partially overlap each other, and if the effects that these first and second transmitter signals have on associate receiver electrodes occur at the same time.

As a specific example of a sensing scheme with concurrent transmission, some embodiments concurrently transmit with multiple transmitter electrodes, where each transmitter electrode is disposed in a different section. As another specific example of a sensing scheme with concurrent transmission, some embodiments concurrently transmit with transmitter electrodes separated from each other by receiver seams. As yet another specific example of a sensing scheme with concurrent transmission, some embodiments concurrently transmit with opposite transmitter electrodes. Where there are multiple transmitter seams such that one transmitter electrode opposes multiple other transmitter electrodes, some or all of these transmitter electrodes may transmit concurrently.

Transmitting in multiple sections concurrently (also called "parallel scanning") allows entire sensor patterns to be scanned more quickly than not transmitting in multiple sections concurrently (without parallel scanning, such as with "serial scanning").

As noted above, some embodiments transmit with multiple transmitter electrodes of a section concurrently, such that at least one receiver in that section receives a mixed response. That is, at least one receiver electrode receives a resulting signal that combines responses corresponding to multiple transmitter signals concurrently transmitted by multiple transmitter electrodes in that section. Concurrently transmitting with multiple transmitter electrodes of a section may offer improved noise resistance and use more power. This may be described by Mi( ) functions that output vectors (indicating many transmitter electrodes) for one or more inputs n.

As a specific example, in some embodiments, a first transmitter electrode in a section transmits concurrently with a second transmitter electrode in that section. The first transmitter electrode transmits a first transmitter signal, and the second sensor electrode transmits a second transmitter signal. If the first transmitter signal and the second electrical produce mathematically independent responses, the concurrent transmissions produces resulting signals that may be used in determining independent results associated with these responses (e.g., a first result associated with a first response, and a second result associated with a second response, where the first and second responses correspond to the first and second transmitter signals, respectively.)

Some embodiments use sensing schemes where, at a particular time, multiple sections have transmitter electrodes transmitting, and at least one of those sections have multiple transmitter electrodes transmitting.

Some embodiments use sensing schemes that comprise transmitting in a sequence spatially moving relative to an ohmic seam. In a first example embodiment with a receiver seam, the transmission sequence starts closer to the receiver seam and moves away from said receiver seam. In a second example embodiment with a receiver seam, the sequence starts away from the receiver seam and moves toward the receiver seam. These sequences correspond to the following transmission relationship. First, a first transmitter electrode disposed on a first side of a receiver seam transmits a first transmitter signal and a second transmitter electrode disposed on a second side of the receiver seam transmits a second transmitter signal. Second, a third transmitter electrode transmits a third transmitter signal after the first transmitter electrode transmits the first transmitter signal, and a fourth transmitter electrode transmitting a fourth transmitter signal after the second transmitter electrode transmits the second transmitter signal. In the first example embodiment, the third transmitter electrode is disposed on the first side of the receiver seam and is farther from the receiver seam than the first transmitter electrode, and the fourth transmitter electrode is disposed on the second side of the receiver seam and is farther from the receiver seam than the second transmitter electrode. In the second example embodiment, the third transmitter electrode is disposed on the first side of the receiver seam and is closer to the receiver seam than the first transmitter electrode, and the fourth transmitter electrode is disposed on the second side of the receiver seam and is closer to the receiver seam than the second transmitter electrode. In both cases, the first transmitter signal may or may not be transmitted concurrently with the second transmitter signal, and the third transmitter signal may or may not be transmitted concurrently with the fourth transmitter signal.

The following is one specific example of a sensing scheme with a spatial sequence starting from closer to a seam and moving away from the ohmic seam. In an example embodiment, a sensing scheme may be described with a same Mi( ) for all sections, where $Mi(n)=(n \bmod N)+1$, and where N is the total number of transmitter electrodes in the i section and n is an integer from 0 to N−1, inclusive. For sensor pattern 600, N=4, and n varies from 0 to 3. With the sensor pattern 600, this sensing scheme means that: 1) opposite transmitter electrodes transmit concurrently and during the same time periods; and 2) the transmission sequence starts at receiver seam 615, in the middle of sensor pattern 600 and moves away from the receiver seam 615, outwards toward the transmitter electrodes at the edges of sensor pattern 600. That is, with this $Mi(n)=(n \bmod N)+1$ descriptive of all of the sections of sensor pattern 600 in an embodiment, the following is true of this embodiments' transmission sequence: TX1,1, TX2,1, TX3,1, and TX4,1 transmit during an initial time interval (interval 1), TX1,2, TX2,2, TX3,2, and TX4,2 transmit during the next time interval (interval 2), TX1,3, TX2,3, TX3,3, and TX4,3 transmit during the next time interval (interval 3), and TX1,4, TX2,4, TX3,4, and TX4,4 transmit during the next time interval (interval 4). In some embodiments where the same Mi( ) is repeated in the next frame periods, after the last time interval, the transmission sequence repeats, and starts over again at the receiver seam 615, from the middle of the sensor pattern 600.

The following is one specific example, in reference to sensor pattern 600, of a sensing scheme with a spatial sequence starting from closer to a seam and moving away from the ohmic seam for at least one section, and starting from farther from the ohmic seam and moving closer to the ohmic seam for at least one other section. This example uses the sections to emulate a set of similarly oriented, distinct sensor devices. The sections have transmitter sequences that are identical relative to a global reference, and not a local reference such as an ohmic seam. In this example, the following transmitter electrodes transmit during the specified time intervals, and other transmitter electrodes do not. During a first time interval, TX1,4, TX2,4, TX3,1, and TX4,1 transmit. During a second time interval, TX1,3, TX2,3, TX3,2, and TX4,2 transmit. During a third time interval, TX1,2, TX2,2, TX3,3, and TX4,3 transmit. During a fourth time interval, TX1,1, TX2,1, TX3,4, and TX4,4 transmit. These four time intervals complete the frame period, and the sequence may repeat, reverse, or change in some other way. In some embodiments, sections 2 and 4 are not scanned in parallel with and/or in the same sequence as sections 1 and 3.

Some embodiments use sensing schemes that do not transmit in (and thus not scan) one or more sections during part of the frame period. For example, some embodiments may transmit in a section during a first part of a frame period, and not transmit in that section during a second part of that frame period. As a specific example, a sensing scheme that can be used with sensor pattern 600 is as follows. During a first part of a frame period, the embodiment transmits in sections 1 and 3 in similar or different ways, and does not transmit in sections 2 and 4. Then, during a second part of the frame period immediately following the first part of the frame period, the embodiment transmits in sections 2 and 4 in similar or different ways (which may be similar or different with the transmission pattern of sections 1 or 3). Then, the embodiment repeats this sequence for additional frames. That is, it retransmits with sections 1 and 3 (and not sections 2 and 4) and then retransmits with sections 2 and 4 (and not sections 1 and 3) in a similar manner, and so on.

Below is another specific example of such a sensing scheme. With reference to sensor pattern 600, during a first part of a frame period, sections 1 and 2 transmit and sections 3 and 4 do not. Specifically, the following transmitter electrodes transmit during sequential time intervals of that frame period, and other transmitter electrodes do not transmit. TX1,4 and TX2,4 transmit during a first time interval (time interval 1). TX1,3 and TX2,3 transmit during the next time interval (time interval 2). TX1,2 and TX2,2 transmit during the next time interval (time interval 3). TX1,1 and TX2,1 transmit during the next time interval (time interval 4). TX3,1 and TX4,1 transmit during the next time interval (time interval 5). TX3,2 and TX4,2 transmit during the next time interval (time interval 6). TX3,3 and TX4,3 transmit during the next time interval (time interval 7). TX3,4 and TX4,4 transmit during the next time interval (time interval 8). This sequence can repeat, reverse, or change in some other way for additional time intervals, depending on the sensing scheme. For example, in some embodiments, after the frame period has ended, the sequence starts over again with TX1,4 and TX2,4 transmitting.

It can be seen from the transmission sequences discussed above that some embodiments do not concurrently transmit with adjacent transmitter electrodes on different sides of a receiver seam. For example, in various embodiments, adjacent transmitter electrodes across a receiver seam do not transmit concurrently. Opposite transmitter electrodes may or may not transmit concurrently. In one example of such a transmission sequence, and in reference to sensor pattern 600, TX1,1 and TX2,1 both transmit (and TX3,1 and TX4,1 do not transmit) during a first time interval, and TX3,1 and TX4,1 transmit (and TX1,1 and TX2,1 do not transmit) during the next time interval.

The following is a specific example described with continued reference to FIG. 6, the following transmitter electrodes transmit during sequential time intervals of a frame period and other transmitter electrodes do not transmit. During at a first time interval, TX1,4, TX2,4, TX3,4, and TX4,4 transmit. During a second time interval that is the next time interval, TX1,3, TX2,3, TX3,3, and TX4,3 transmit. During a third time interval that is the next time interval, TX1,2, TX2,2, TX3,2, and TX4,2 transmit. During a fourth time interval that is the next time interval, TX3,1 and TX4,1 transmit. During a fifth time interval that is the next time interval, the TX1,1 and TX2,1 transmit. This frame period for sections having four transmitter electrodes each thus comprises five time intervals. After this, the sequence may start over and repeat. It is appreciated that this scan sequence starts from away from the receiver seam 615 (e.g., at the edges of the sensor pattern), and moves toward receiver seam 615. Other sensing schemes may comprise scan sequences that start at the receiver seam 615, and move away from the receiver seam 615 (e.g., towards the edges of the sensor pattern). For example, a reverse of the transmission sequence above may be used. That is, and in reference to FIG. 6, and a first time interval may involve transmission with TX1,1 and TX2,1, a second time interval may involve transmission with TX3,1 and TX4,1, a third time interval may involve transmission with TX1,2, TX2,2, TX3,2, and TX4,2 and so on.

It can also be seen from the transmission sequences discussed above that some embodiments concurrently transmit with transmitter electrodes only during part of the frame period. For example, some embodiments have sections separated by a receiver seam. When a transmitter electrode very near the receiver seam (e.g., right next to the receiver seam) is transmitting in one section, no transmitter electrodes in a section on the other side of the receiver seam will transmit. By way of example, and in reference to FIG. 6, during a time interval when TX1,1 transmits in Section 1, no transmitter electrodes in Section 3 (which is across receiver seam 615 from Section 1) transmit. This may be carried to transmitter electrodes also separated by a transmitter seam. Further in reference to FIG. 6, in one embodiment, TX1,1 transmits in Section 1 during a time interval when no transmitter electrodes in either Section 3 or Section 4 transmit.

Some embodiments utilize sensing schemes that suspend transmissions during one or more non-transmitting time intervals (also "quiet time intervals") of the frame period. For example, some sensing schemes utilize quiet time intervals within frames and/or between frames, during which no transmitter electrode transmits (all transmitter electrodes TX are not transmitting). Including time periods with suspended transmissions may be for any number of reasons, such as for interference detection or to decrease cross-talk.

In terms of interference detection, some embodiments receive on one or multiple receiver electrodes during the quiet time intervals. Since the transmitter electrodes do not transmit during the quiet time intervals, the signals received by the receiver electrodes correspond to interferences (e.g., from the environment).

In terms of decreasing cross-talk, in some embodiments, there is a trade-off between the amount of time spent transmitting with a particular transmitter to achieve improved signal-to-noise ratio (SNR) versus a higher frame rate. This may be due to a variety of factors. Example factors include the transient response of any kind of filtering that may occur in transmission or reception. In some embodiments, the frame rate is set in such a way that the time interval may be too short to allow effects as any filtering effects to settle out completely (e.g., to the level of noise, to some level set by specification requirements, etc). Thus, a residual left over from an earlier time interval (e.g., time interval k) can affect a measurement made for a later time interval (e.g., time interval k+1). In many embodiments, this becomes even more noticeable at the transition from the end of one frame to the beginning of the next. Such residual information can have the effect of causing erroneous sensing. For example, an input object located at a receiver seam may interact with a first transmitter electrode on a first side of the receiver seam that transmits during time interval k, and with a second transmitter electrode on a second side of the receiver seam that transmits during time interval k+1. This input object may be detected as being located at the edge of the sensor, have a non-uniform impact across seams relative to interiors of sections and cause errors in position determinations, etc. Utilizing one or more quiet time interval (s) at the beginning and/or end of a frame period can reduce the detrimental effects of numerous such issues.

It is appreciated that many sensing schemes with different transmission patterns are possible and contemplated, including those which utilize one or more quiet time intervals per frame period. For example, any of the sensing schemes described herein may have one or more quiet time intervals added to it; these added quiet time interval(s) may be the first time interval, the last time interval, an intermediate time intervals, or a combination thereof. As a specific example, one quiet time interval may be added at the end of a frame period, before additional frame scans occur.

In one example embodiment, a transmission pattern with a quiet time interval begins with transmitter electrode(s) located at a receiver seam transmitting and proceeds with a transmitter pattern moving spatially away from the receiver seam (e.g., outward toward the edges of a sensor pattern). For example, with continued reference to FIG. 6, in one embodiment, the following transmitter electrodes transmit during time intervals of a frame period and other transmitter electrodes do not transmit. During a first time interval, no transmitter electrodes transmit. During a second time interval immediately following the first time interval, TX1,1 transmits. During a third time interval immediately following the second time interval, TX3,1 transmit. During a fourth time interval immediately following the third time interval, TX1,2 and TX3,2 transmit. During a fifth time interval immediately following the fourth time interval, TX1,3 and TX3,3 transmit. During a sixth time interval immediately following the fifth time interval, TX1,4 and TX3,4 transmit. This results in six time intervals to scan two sections having four transmitter electrodes each. Section 2 and/or section 4 may be scanned in parallel with the scanning of sections 1 and 3. After this, the sequence may start over. Or, if sections 2 and 4 were not scanned in parallel with sections 1 and 3, they may be scanned next.

Some embodiments reduce or prevent artifacts near receiver seams by synchronizing opposite transmitter electrodes. Some embodiments tightly synchronize opposite transmitter electrodes. That is, some embodiments transmit, with opposite transmitter electrodes, transmitter signals of substantially the same phase, amplitude, waveform shape, and/or frequency (or with a phase, amplitude, waveform shape, and/or frequency relationship that is substantially constant from frame to frame), and also begin and end transmission at substantially the same time. This approach may help reduce signal degradation near a receiver seam. As one specific example, and in reference to FIG. 6, in one embodiment, transmitter electrodes meeting at the transmitter seam 605 are synchronized to transmit in the same phase and during the same time interval (e.g., TX1,4 and TX2,4).

Sensing schemes involving sensor patterns with split pixels are, in many embodiments, similar to those which have been previously described. For example, the transmission pattern may mean transmitting in a way spatially moving towards or away from an ohmic seam. As other examples, the transmission pattern may involve concurrently transmitting on opposite transmitter electrodes or include quiet time intervals. As a further example, transmitter electrodes that are adjacent to each other and on opposite sides of a seam may transmit at different times. However, where the split pixel involves a receiver seam that overlaps and runs along a transmitter electrode, no set of transmitter electrodes are adjacent to each other and are on opposite sides of this seam.

Figure 10:
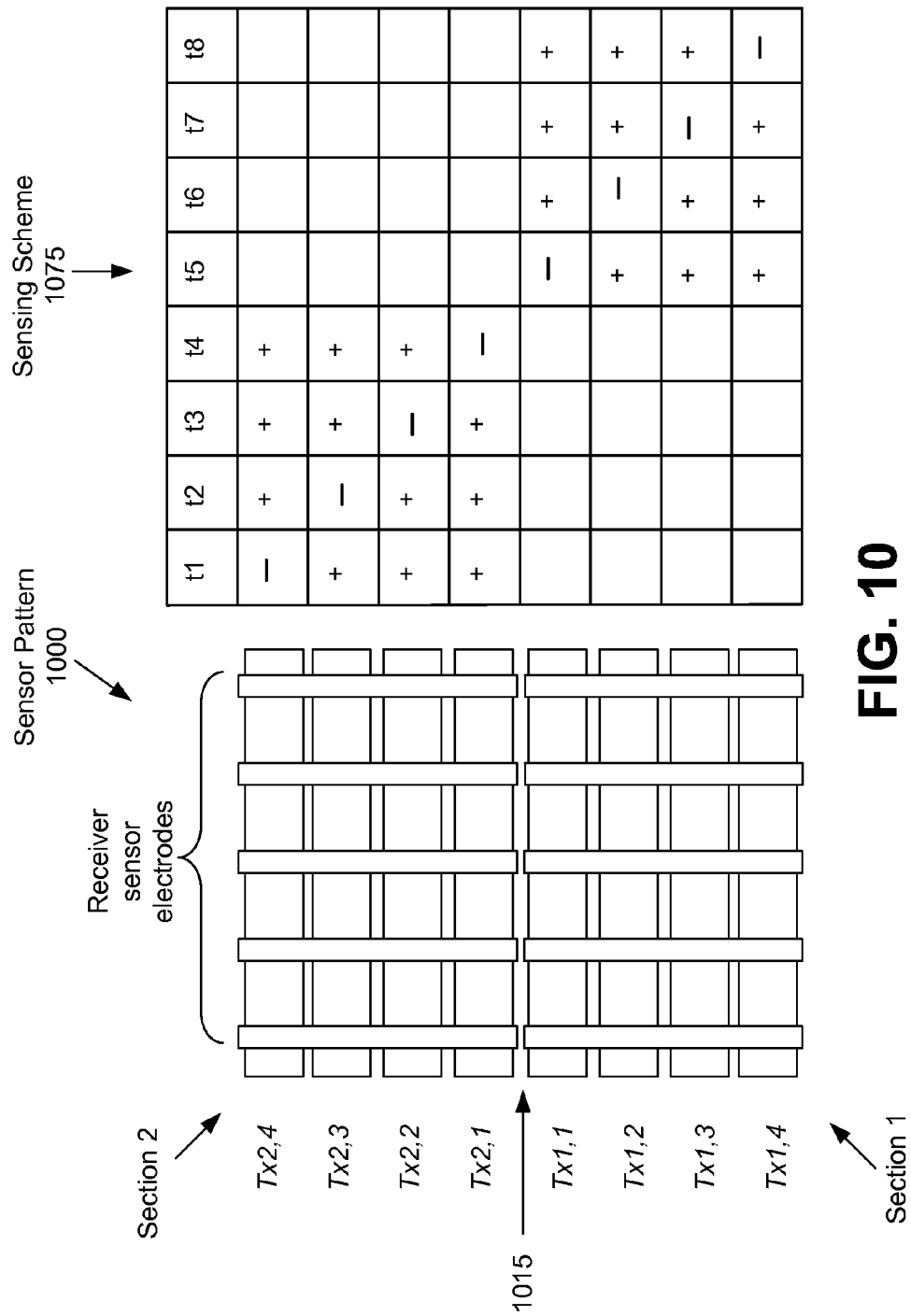
FIGS. 10-12 show example multi-sectioned sensor patterns along with example sensing schemes with coding patterns, according to various embodiments.
Figure 11:
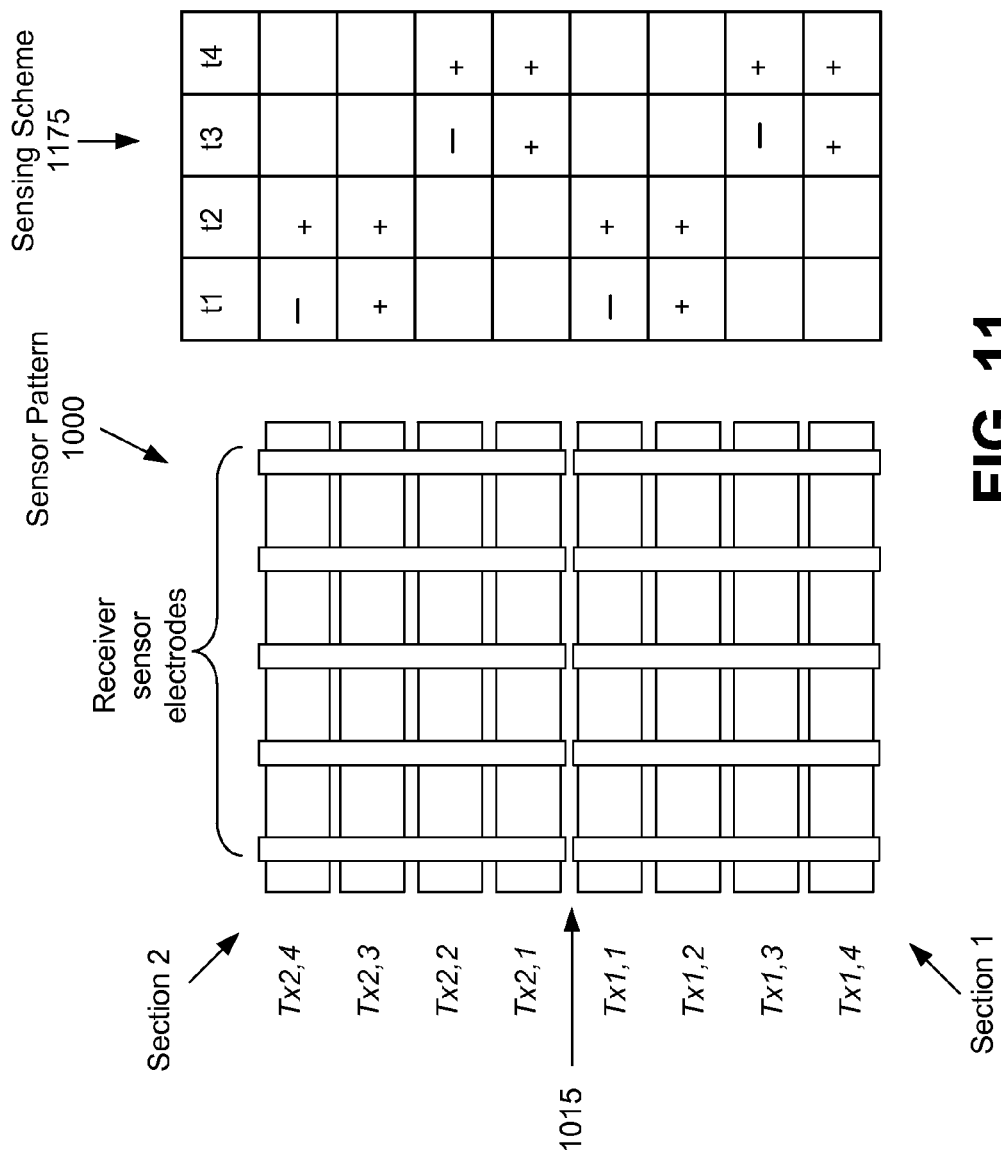
Figure 12:
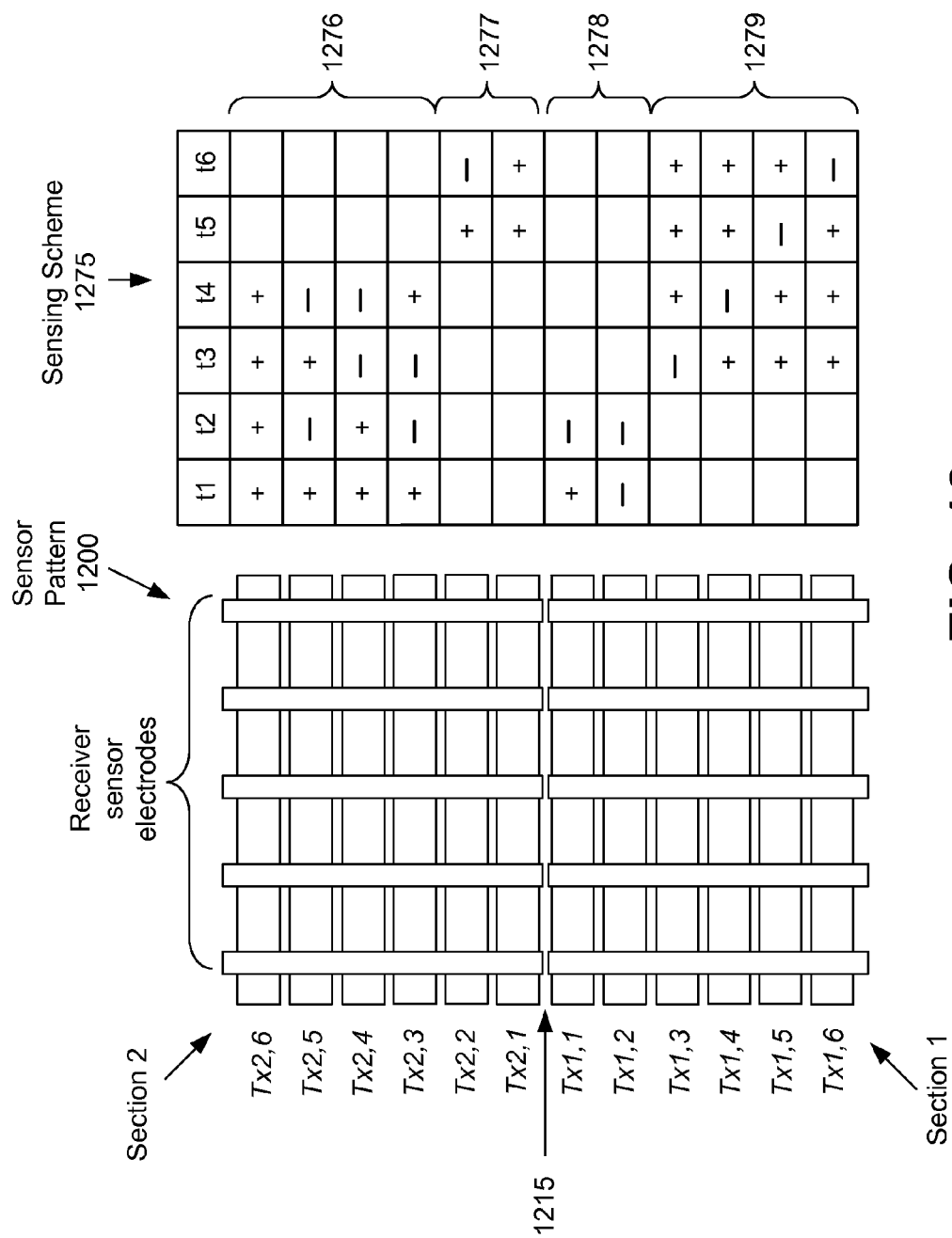

Coded Transmissions

Where a sensing scheme involves concurrent transmission with multiple transmitter electrodes, some or all of these multiple transmitter electrodes may transmit transmitter signals that are uniquely coded. For example, the transmitter signals may conform to a variety of different modulation codes, including codes such as Walsh codes Hadamard codes, and pseudo-random sequences. The codes may also be of any appropriate length. The transmitter signals may express the codes in any appropriate way, such as through differences in frequency, amplitude, phase, etc. For example, some embodiments differently modulate the frequencies of concurrent transmissions, and appropriately demodulate the received resulting signals to obtain independent results. Each independent result is associated with a response corresponding to one of the concurrent transmissions. FIGS. 10-12 show examples of specific multi-sectioned sensor patterns along with specific example sensing schemes having coding patterns, according to various embodiments. Other implementations may have different sensor patterns and/or other coding patterns.

In FIGS. 10-12, the sensing schemes with coding patterns are shown as a table. The columns indicate different sequential time intervals (e.g., t1, t2, etc.). The rows contain coding states for their respectively aligned transmitter electrodes. A "+" symbol in table means that the transmitter signal transmitted by the corresponding transmitter electrode during that time interval has a first value for the encoding characteristic. In contrast, a "−" symbol in the table means that the transmitter signal transmitted by the corresponding transmitter electrode during that time interval has a second value for the encoding characteristic. An empty box means no transmitter signal is being transmitted.

For example, some embodiments modulate transmitter electrodes with a periodic waveform when transmitting. Example periodic waveforms include square waves, saw tooth waves, triangle waves, sinusoids, combinations thereof, more complex waveforms, etc. Where phase as the encoding characteristic for such embodiments, a "+" means that the transmitter transmits with the applicable waveform at a first phase, and a "−" symbol indicates that the transmitter transmits with the applicable waveform at a second phase. In one embodiment, the first and second phases are 180 degrees apart. In other embodiments, other phase differences are utilized.

FIG. 10 shows a sensor pattern 1000 that is divided into two sections (section 1, section 2) by a receiver seam 1015. A plurality of transmitter electrodes and receiver electrodes are illustrated. Sensing scheme 1075 illustrates one example coding pattern which may be used with sensor pattern 1000. Specifically, sensing scheme 1075 involves concurrent transmission, according to a Hadamard code of length 4, with all four transmitter electrodes of section 2 concurrently transmitting during sequential time intervals t1 to t4. Sensing scheme 1075 further involves concurrent transmission, according to the same Hadamard code of length 4, with all four transmitter electrodes of section 1 during sequential time intervals t5 to t8.

In FIG. 10, the top row of sensing scheme 1075 indicates that a transmitter signal having a first value for the encoding characteristic is transmitted on TX2,4 during time interval t1, that a transmitter signal having a second value for the encoding characteristic is transmitted on TX2,4 during time intervals t2-t4, and that TX2,4 does not transmit during time intervals t5-t8. For example, TX2,4 may transmit with a waveform at a first phase during time interval t1, and transmit with the waveform at a second phase during time intervals t2-t4, and not transmit during time intervals t5-t8. Other rows sensing scheme 1075 may be interpreted in a similar fashion. That is, TX2,3 transmits with a transmitter signal having the second value for the encoding characteristic during time intervals t1, t3, and t4, transmits with the transmitter signal having the first value for the encoding characteristic during time interval t2, and does not transmit during time intervals t5-t8. And, TX2,2 transmits with a transmitter signal having the second value for the encoding characteristic during time intervals t1, t2, and t4, transmits with the transmitter signal having the first value for the encoding characteristic during time interval t3, and does not transmit during time intervals t5-t8. And, TX2,1 transmits with a transmitter signal having the second value for the encoding characteristic during time intervals t1-t3, transmits with the transmitter signal having the first value for the encoding characteristic during time interval t4, and does not transmit during time intervals t5-t8. Similarly, sensing scheme 1075 indicates the coding for TX1,1, TX1,2, TX1,3, and TX1,4.

Sensing scheme 1075 depicts one embodiment where there is no concurrent transmission with transmitter electrodes in section 1 and section 2 of sensor pattern 1000. However, other embodiments of a sensing scheme with a coding pattern may have concurrent transmission with transmitter electrodes of different sections. For example, an embodiment may have the same sensor pattern 1000, use the same length 4 codes as those of sensing scheme 1075, but concurrently transmit with all eight transmitter electrodes for four time intervals (instead of concurrently transmitting with the four transmitter electrodes of section 1 for four time intervals and concurrently transmitting with the four transmitter electrodes of section 2 for four other time intervals).

FIG. 11 shows sensor pattern 1000 with a different sensing scheme 1175 having fewer time intervals than sensing scheme 1075 of FIG. 10. In FIG. 11, the top row of sensing scheme 1175 indicates that a TX2,4 transmits a transmitter signal having a first value for the encoding characteristic during time interval t1, that TX2,4 transmits a transmitter signal having a second value for the encoding characteristic during time interval t2, and that TX2,4 does not transmit during time intervals t3-t4. For example, during time interval t1, TX2,4 may transmit with a waveform of a first phase, and during time interval t2, TX2,4 may transmit with a waveform of a second phase. Other rows of sensing scheme 1175 may be interpreted in a similar fashion. Sensing scheme 1175 depicts one embodiment with concurrent transmission with transmitter electrodes in sections 1 and 2 of sensor pattern 1000.

FIG. 12 shows a sensor pattern 1200 that is divided into two sections (section 1, section 2) by a receiver seam 1215, along with a sensing scheme 1275. In FIG. 12, the top row of sensing scheme 1275 indicates that a TX2,6 transmits a transmitter signal having a first value during time intervals t1-t4 and does no transmit during time intervals t5-t6. For example, T2,6 may transmit a transmitter signal with a waveform of a first phase during time intervals t1-t4 and not transmit during time intervals t5-t6. Other rows of sensing scheme 1275 may be interpreted in a similar fashion. Sensing scheme 1275 depicts concurrent driving of transmitter electrodes in sections 1 and 2 of sensor pattern 1200. Sensing scheme 1275 also uses different code lengths (code lengths four and two) and code types. The four rows identified by bracket 1276 represent a 4×4 Walsh type of Hadamard coding. The two rows identified by bracket 1277 represent an orthogonal 2×2 coding, as do the two rows identified by bracket 1278. The four rows identified by bracket 1279 represent a 4×4 Non-Walsh type of Hadamard coding. Thus, sensing scheme 1275 also highlights that different code types and code lengths may be used within a sensing scheme.

Use of One or Multiple Integrated Circuits with a Sensor Pattern

One or multiple integrated circuits (ICs) may be utilized with a sectioned sensor pattern of an input device, such as input device 100, according to some embodiments. The one or multiple ICs may each comprise an application-specific integrated circuit (ASIC) or be a general purpose integrated circuit.

In embodiments with a single IC, this single IC may be configured to operate the sensor electrodes to acquire an image of input (or lack thereof) in the associated sensing region. The single IC may also be configured to perform further processing on the image, provide the image to another processor (such as the CPU of an electronic system), etc.

In embodiments with multiple ICs, individual ICs may be configured to perform similar or different functions. For example, some embodiments comprise multiple sensor electrode ICs (SEICs) that are configured to be communicatively coupled to different sets sensor electrodes. These SEICs may be communicatively coupled to (and perhaps be configured to operate) only transmitter electrodes, only receiver electrodes, or a combination of transmitter and receiver electrodes. Similarly, these SEICs may be communicatively coupled to sensor electrodes of only one section, to sensor electrodes that are contiguous across an ohmic seam, or to different sensor electrodes of multiple sections. Some multi-IC embodiments may comprise additional ICs that are communicatively coupled to the SEICs, and perform other functions than direct operation of the sensor electrodes.

Figure 13:
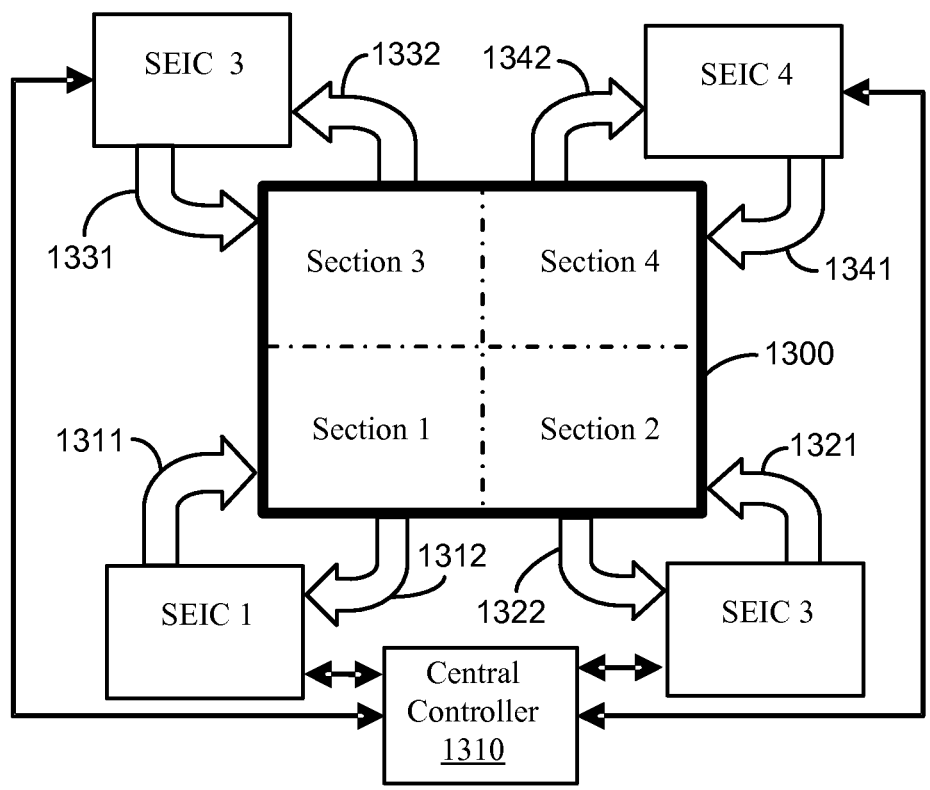
FIG. 13 and FIG. 14 illustrate how multiple integrated circuits may be utilized by some input devices, according to some embodiments.
Figure 14:
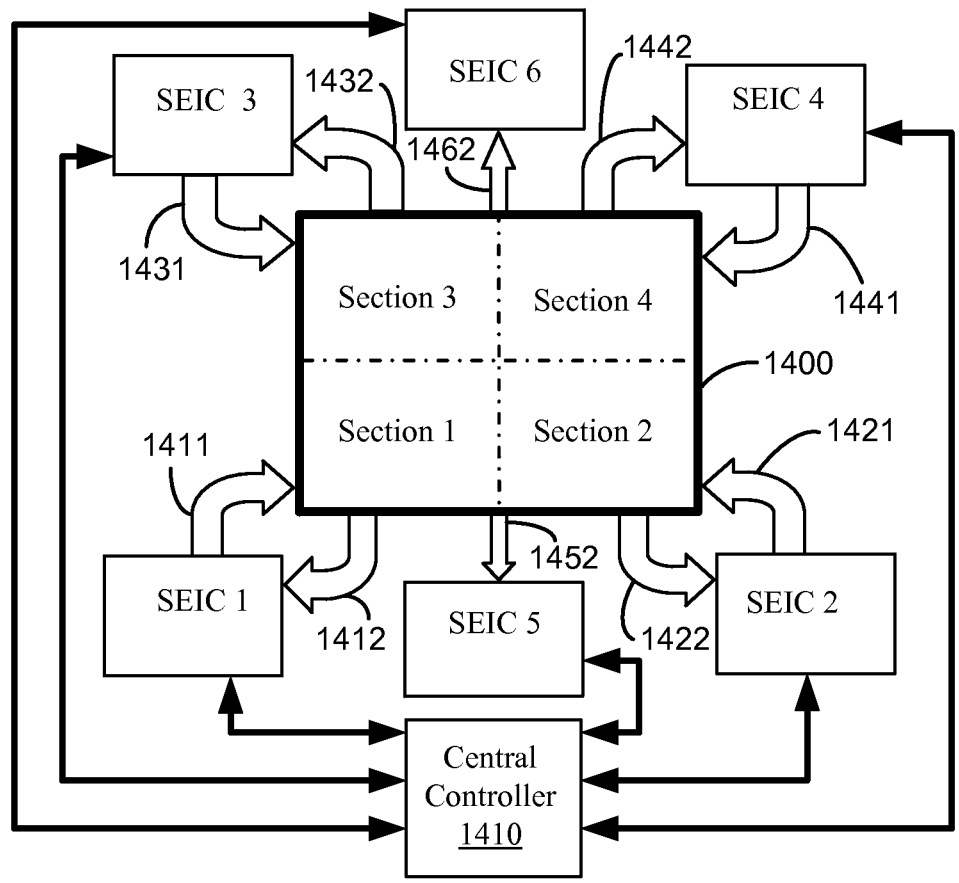

FIGS. 13-14 shows some embodiments with multiple integrated circuits. FIG. 13 shows a portion of an input device 100B. Input device 100B uses a four-sectioned sensor pattern 1300. In one embodiment, sensor pattern 1300 is similar or identical to sensor pattern 600 of FIG. 6. Input device 100B comprises multiple sensor electrode integrated circuits (SEICs 1-4), each of which is communicatively coupled to all of the transmitter and receiver electrodes of a section. Arrows 1311, 1321, 1331, and 1341 indicate routing lines from SEICs 1, 2, 3, and 4 to the transmitter electrodes of sections 1, 2, 3, and 4, respectively. Similarly, arrows 1312, 1322, 1332, and 1342 indicate routing lines from the receiver electrodes of sections 1, 2, 3, and 4 to SEICs 1, 2, 3, and 4, respectively. Input device 100B further comprises a central controller 1310, which may comprise one or multiple IC(s). Central controller 1310 is utilized to coordinate SEICs 1-4, analyze the information received from SEICs 1-4 about input in the sensing region, and communicate with other components as appropriate. For example, central controller 1310 may coordinate the sensing scheme for input device 100B. As another example, central controller 1310 may receive responses from SEICs 1-4 that correspond to the different transmitter signals, scale them as appropriate, and compile them into a single image. The central controller 1370 may perform further processing on the image, and/or provide the image to another processor, such as the CPU of an electronic system (not shown).

In FIG. 14, an input device 100C is shown. Input device 100C comprises a 4-sectioned sensor pattern 1400 communicatively coupled with six SEICs (SEICs 1-6) (rather than the four SEICs shown in input device 100B of FIG. 13). In one embodiment, sensor pattern 1400 is similar or identical to sensor pattern 600 of FIG. 6. SEICs 5 and 6 are shared between sections (e.g., sections 1 and 2 share SEIC 5 and sections 3 and 4 share IC 6). In input device 100C, each of SEICs 1-4 is communicatively coupled to all of the transmitter electrodes, and some of the receiver electrodes, of a section. In contrast, SEICs 5-6 are receiver integrated circuits that communicatively couple only to receiver electrodes. Specifically, SEIC 5 is communicatively coupled to some receiver electrodes of sections 1 and 2, and SEIC 6 is communicatively coupled to some receiver electrodes of sections 3 and 4. Arrows 1411, 1421, 1431, and 1441 indicate routing lines from ICs 1, 2, 3, and 4 to the transmitter electrodes of sections 1, 2, 3, and 4, respectively. Meanwhile, arrows 1412, 1422, 1432, 1442, 1452, and 1462 indicate routing lines from sensor electrodes to SEICs: from section 1 to SEIC 1, section 2 to SEIC 2, section 3 to SEIC 3, section 4 to SEIC 4, sections 1 and 2 to SEIC 5, and sections 3 and 4 to SEIC 6. Input device 100C further comprises a central controller 1410, which may comprise one or multiple IC(s). Central controller 1410 is utilized to coordinate SEICs 1-6, analyze the information received from SEICs 1-6 about input in the sensing region, and communicate with other components as appropriate Some embodiments with multiple ICs partition the processing for converting received resulting signals into input information among those multiple ICs. For example, input device 100B of FIG. 13 may split the signal-to-input information processing among SEICs 1-4 and central controller 1310 of input device 100B. These ICs may split the following responsibilities (if applicable to the system) in any variety of ways: storing a baseline reading, weighting or scaling, signal conditioning, choosing a sensing frequency, coordinating transmission patterns, signal processing, determining positional information, applying ballistics, recognizing gestures, controlling sleep and wake-up input device 100B, and communicating with a component outside of input device 100B, such as a host PC.

Some embodiments with multiple ICs synchronize these ICs. This can improve performance, such as by reducing potential artifacts introduced by ohmic seams or multiple ICs. For example, some embodiments include a common clock so that all ICs coupled to the common clock are synchronized. The common clock can be used, for example, to ensure that the transmitter signals used by the ICs are all at the same frequency, or that the receiver electrodes all operate during the proper periods. This synchronization can reduce beat frequencies that result from destructive interference; these beat frequencies can be result in mistaken input. In various embodiments, a common clock can be obtained by having one IC drive its clock signal out, and having other ICs receive the clock signal. For example, with respect to FIG. 13, controller 1310 or any of SEICs 1-4 may provide this clock signal. Further, controller 1310 may provide a synchronization signal to initiate the scanning of new frame, and further synchronize the ICs.

Example Processing System

Figure 15:
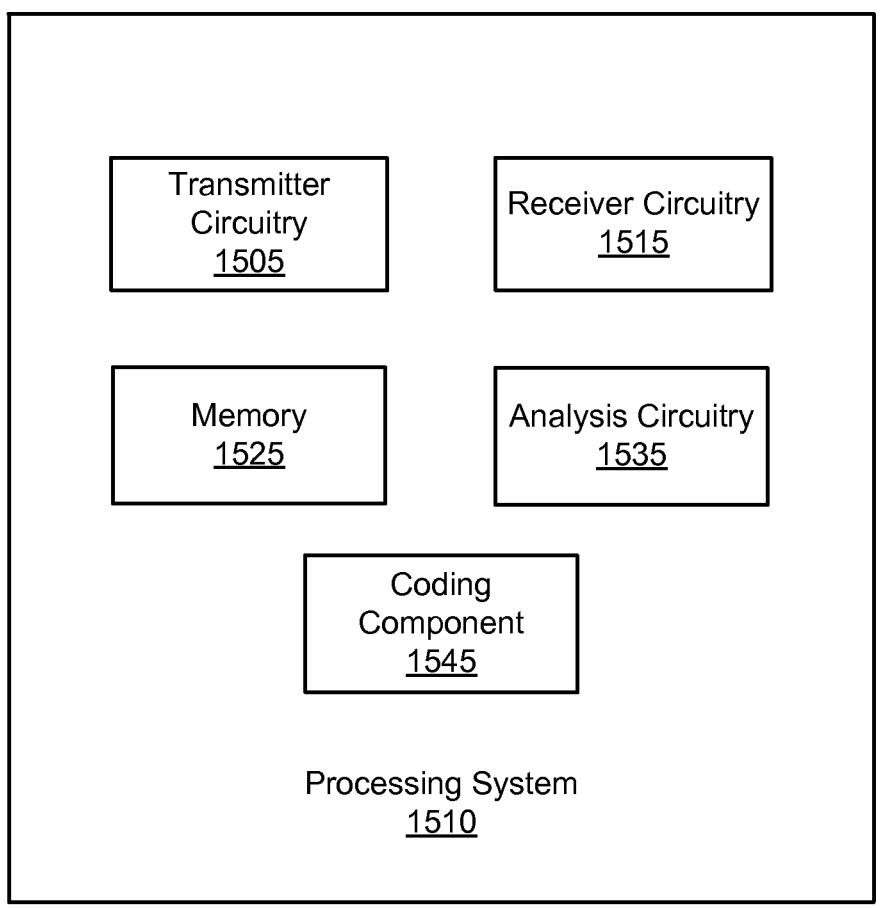
FIG. 15 illustrates an example processing system which may be utilized with an input device, according to various embodiments.

FIG. 15 illustrates an example of a processing system 1510, which may be utilized with an input device, according to various embodiments. Processing system 1510 may be an implementation of processing system 110 of input device 100. Other processing systems may be similarly implemented. In one embodiment, processing system 1510 is configured to be communicatively coupled with a plurality of transmitter electrodes and a plurality of receiver electrodes (such as those illustrated in various Figures). Processing system 1510 includes transmitter circuitry 1505 and receiver circuitry 1515. In various embodiments, transmitter circuitry 1505 is located in one or multiple ICs. That is, in some embodiments, transmitter circuitry 1505 is located entirely in a single IC; and, in some embodiments, transmitter circuitry 1505 is located in multiple ICs. Similarly, in various embodiments, receiver circuitry 1515 may comprise portions of one or multiple ICs. The ICs implementing transmitter circuitry 1505 may or may not also implement receiver circuitry 1515. That is, the relevant IC may include only receiver circuitry, only transmitter circuitry, or some receiver circuitry and some transmitter circuitry. Some embodiments additionally include one or more of the following: memory 1525, analysis circuitry 1535, and coding component 1545. Any or all of these circuitry components may be implemented with part or all of one or more ICs of processing system 1510.

Transmitter circuitry 1505 operates to transmit or not transmit transmitter signals with one or more transmitter electrodes in any of the manners or their equivalents which have been described herein. For example, in a given time interval, transmitter circuitry 1505 may cause one or more transmitter electrodes of a plurality of transmitter electrodes to transmit. Where there are multiple concurrent transmissions, transmitter circuitry 1505 may be configured to cause transmissions that are not coded, or that are coded.

Receiver circuitry 1515 operates to receive, via receiver electrodes, resulting signals with responses that correspond to the transmitted transmitter signals in any of the manners or their equivalents which have been described herein. For example, receiver electrodes may receive in series (one at a time) or in parallel (multiple receiver electrodes receive concurrently).

Where transmitter circuitry 1505 is located in multiple ICs, a same IC may operate and cause transmissions by transmitter electrodes in the same or in different sections. Also, different ICs of transmitter circuitry 1505 may operate and cause transmissions by transmitter electrodes in the same or in different sections.

Similarly, where receiver circuitry 1515 is located in multiple ICs, a same IC may operate and receive resulting signals from receiver electrodes in the same or in different sections. Also, different ICs of receiver circuitry 1515 may receive resulting signals from receiver electrodes in the same or in different sections.

The resulting signals include the responses corresponding to the transmitter signals. A response corresponding to a transmitter signal reflects the effect of the transmitter signal on the receiver electrode through their capacitive coupling. These resulting signals also include effects due of interference (e.g., environmental noise), etc. A resulting signal received by a receiver electrode may include responses from multiple transmitter signals, such as when multiple transmitter electrodes proximate to the receiver electrode transmit concurrently.

In one embodiment comprising multiple ICs that implement receiver circuitry 1515, the responses derived from the resulting signals are scaled or otherwise adjusted such that the responses provided by the ICs are comparable. For example, the values provided by the different ICs may be compared to different baseline values corresponding to those ICs. As another example, a first IC may provide a first value proportional to the first response corresponding to a first transmitter signal and a second IC may provide a second value proportional to a second response corresponding to the first transmitter signal or a second transmitter signal. The first and second values may differ due to differences between the first and second ICs (e.g., in gain), rather than because the actual electrical responses differ. The processing system 1510 may uses calibration information stored in a memory, such as memory 1525, to adjust at least one of the first and second values such that they are comparable.

The processing system 1510 may use the calibration information to adjust the first value to produce a first adjusted value, such that a first proportionality of the first adjusted value to the first response is substantially equal to a second proportionality of the second value to the second response. This adjusts one value to match another value. As another example, the processing system 1510 may use the calibration information to adjust both the first and second values to produce first and second adjusted values, respectively, such that a first proportionality of the first adjusted value to the first response is substantially equal to a second proportionality of the second adjusted value to the second response. This adjusts multiple values to a common scale. Adjusting values facilitates normalizing responses across different ICs, and can help compensate for differences between different circuitry (such as in amplification). These adjustments may be linear or non-linear.

Calibration information for producing adjusted values may be obtained by performing calibration functions with ICs. For example, during manufacture, output values to known input may be obtained at an appropriate level (e.g., per IC, per receiver electrode, per pixel) and used to produce this calibration information. This calibration information may be stored in memory 1525. In some embodiments with multiple ICs, each IC has a part of memory 1525 for storing calibration information for the receiver electrodes and circuitry associated with that IC; and, each SEIC adjusts the values that it provides. In some embodiments with multiple ICs including a central controller (such as the central controller 1310 and 1410 of FIGS. 13-14), the central controller stores the calibration values and calibrates the values received from the SEICs. In some embodiments with multiple ICs including SEICs and a central controller, both the SEIC(s) and the central controller store calibration information and adjust values. For example, each SEIC may store a correction function or table for calibrating between receiver circuits of that SEIC, and the central controller may store a correction function or table for calibrating between SEICs.

The processing system 1510 may also comprise analysis circuitry 1535. This analysis circuitry is configured to receive information based on a first response that is itself received by a first receiver circuit from a first receiver electrode. The analysis circuitry is also configured to receive information based on a second response that is itself received by a second receiver circuit from a second receiver electrode. The first and second receiver circuits are part of receiver circuitry 1515, and may be part of a same IC or parts of different ICs. The analysis circuitry 1535 may be configured to perform the adjustments described above In some embodiments, the analysis circuitry 1535 is also configured to estimate amounts of capacitive coupling associated with different pixels. In embodiments with a plurality of split pixels, the analysis circuitry 1535 estimates amounts of capacitive coupling associated with the split pixels using information based on responses of the appropriate partial pixels. Analysis circuitry 1535 may make this estimate in any appropriate way, including by combining partial pixel measurements. In some instances, partial pixel measurements are scaled or adjusted as appropriate (e.g., using calibration information from memory 1525). Such scaling or adjusting is more likely if separate ICs contain the receiver circuitry associated with the partial pixels of a split pixel.

As a specific example, analysis circuitry 1535 first receives information from all of the partial pixels that make up a spit pixel. Then, analysis circuitry 1535 applies a weighting to at least one partial pixel of the split pixel. This adjusts the contribution(s) of the partial pixels such that they are comparable. The weighting can be based, among other bases, on a size, shape, or arrangement of the sensor electrodes providing the localized capacitive coupling of the at least one partial pixel. Then, analysis circuitry 1535 may sum the weighted/unweighted measurements of the partial pixels to produce an estimate of the capacitive coupling of the split pixel.

Analysis circuitry 1535 may also perform other functions. For example, analysis circuitry 1535 may compile a frame image from the different pixel responses received from the multiple sections of a sectioned sensor pattern.

The processing system 1510 may also include coding component 1545. When included in processing system 1510, coding component 1545 operates to uniquely encode transmitter signals that are concurrently transmitted with at least two of the plurality of transmitter electrodes of a sensor pattern. Several examples of coding that may be accomplished by coding component 1545 are described above. Such coding can assist in differentiating received responses that are intermixed in a same resulting signal due to concurrent transmission of transmitter signals.

Example Method of Capacitive Sensing

FIGS. 16A and 16B illustrate a flow diagram 1600 of an example method of capacitive sensing with a capacitive sensing device, according to various embodiments. The capacitive sensing device comprises a plurality of transmitter electrodes sectioned by an ohmic seam and a plurality of receiver electrodes sectioned by the ohmic seam. For purposes of illustration, reference will be made to sensor pattern 600 of FIG. 6; however, it is appreciated that procedures described in the method of flow diagram 1600 may be implemented using other sensor patterns, including other sensor patterns described herein and their equivalents. For example, the flow diagram 1600 also applies to sensor patterns with more or fewer transmitter or receiver seams, with more or fewer sections, with split pixels, and the like. Additionally, for purposes of illustration, reference will be made to processing system 110 of FIG. 1 and processing system 1510 of FIG. 15; however, it is appreciated that in other implementations another component (e.g. a host compute) may implement some or all of the procedures illustrated in flow diagram 1600. In some embodiments, not all of the procedures described in flow diagram 1600 are implemented. In some embodiments, other procedures in addition to those described may be implemented. In some embodiments, procedures described in flow diagram 1600 may be implemented in a different order than illustrated and/or described.

At 1610 of flow diagram 1600, in one embodiment, a first transmitter signal is transmitted with a first transmitter electrode of a plurality of transmitter electrodes. The first transmitter electrode is disposed on a first side of an ohmic seam. With reference to FIG. 6, in one method of operating an embodiment with sensor pattern 600, this comprises transmitting a first transmitter signal with a sensor electrode in one of sections 1-4 (e.g., TX1,1).

At 1620 of flow diagram 1600, in one embodiment, a second transmitter signal is transmitted with a second transmitter electrode of the plurality of transmitter electrodes. The second transmitter electrode is disposed on a second side of an ohmic seam from the first transmitter electrode. With reference again to FIG. 6, in one method of operating an embodiment with sensor pattern 600, this comprises transmitting with a transmitter electrode in another one of sections 1-4, which may be separated by ohmic seam 605 or ohmic seam 615.

In one embodiment, the ohmic seam of 1610 and 1620 is a transmitter seam, and the second transmitter electrode is disposed opposite the first transmitter electrode (e.g., TX2,1 is opposite TX1,1 across transmitter seam 605). In one such embodiment, transmitting the second transmitter signal with the second transmitter electrode may comprise: transmitting the second transmitter signal with the second transmitter electrode during a second time period which overlaps at least partially with a first time period during which the first transmitter signal is transmitted with the first transmitter electrode. Such overlap may be partial or complete, in various embodiments.

In one embodiment, the ohmic seam of 1610 and 1620 is a receiver seam and the second receiver electrode is disposed from first receiver electrode in a non-adjacent manner (e.g., TX3,2 is disposed on a different side of receiver seam 615 than TX1,1 and is not adjacent to TX1,1). In one such embodiment, the transmitting of the second transmitter signal with the second transmitter electrode may comprise: transmitting the second transmitter signal with the second transmitter electrode during a second time period which overlaps at least partially with a first time period during which the first transmitter signal is transmitted with the first transmitter electrode. Such overlap may be partial or complete, in various embodiments.

In one embodiment, the ohmic seam of 1610 and 1620 is a receiver seam, and the second receiver electrode is disposed in an adjacent manner to the first receiver electrode (e.g., TX3,1 is disposed on the a different side of receiver seam 615 than TX1,1 and is also adjacent TX1,1). In one such embodiment, the transmitting the second transmitter signal with a second transmitter electrode may comprise: transmitting the second transmitter signal with the second transmitter electrode during a second time period which non-overlaps at least partially with a first time period during which the first transmitter signal is transmitted with the first transmitter electrode. Such non-overlap may be partial, or be overlap at all.

At 1630 of flow diagram 1600, in one embodiment, a first response corresponding to the first transmitter signal is received with a first receiver electrode of the plurality of receiver electrodes, where the first receiver electrode is disposed on the first side of the ohmic seam. With continued reference to the example of FIG. 6, this can comprise receiving with any receiver electrode in the same section as the first transmitter electrode.

At 1640 of flow diagram 1600, in one embodiment, a second response corresponding to the second transmitter signal is received with a second receiver electrode of the plurality of receiver electrodes, where the second receiver electrode is on the second side of the ohmic seam. With continued reference to the example of FIG. 6, this can comprise receiving with any receiver electrode the same section as the second transmitter electrode.

At 1650 of flow diagram 1600, in one embodiment, the method further includes: transmitting transmitter signals in a sequence spatially moving relative to the ohmic seam (which could be a receiver seam). The sequence can be a first sequence that moves away from the ohmic seam or a second sequence that moves towards the ohmic seam. A variety of such sequences have been described herein.

At 1660 of flow diagram 1600, a third transmitter electrode is disposed on the first side of the ohmic seam, and the method of flow diagram 1600 further includes transmitting a third transmitter signal with the third transmitter electrode concurrently with the transmitting of the first transmitter signal with the first transmitter electrode. This transmission is made such that the first receiver electrode receives a resulting signal that combines the first response and a third response corresponding to the third transmitter signal. The first transmitter signal and the third transmitter signal may be uniquely coded in any of the manners or their equivalents which have been described herein.

A 1670 of flow diagram 1600, independent results associated with the first response and the third response are determined using the resulting signal. In some embodiments, analysis circuitry such as analysis circuitry 1535 of processing system 1510 (see FIG. 15) can decode by utilizing the unique coding of the first and second transmitter signals, and thus determining independent results from the combined resulting signal.

Thus, the embodiments and examples set forth herein were presented in order to best explain the present invention and its particular application and to thereby enable those skilled in the art to make and use the invention. However, those skilled in the art will recognize that the foregoing description and examples have been presented for the purposes of illustration and example only. The description as set forth is not intended to be exhaustive or to limit the invention to the precise form disclosed.

What is claimed is:

1. An input device comprising:
   a first plurality of sensor electrodes comprising first transmitter electrodes and first receiver electrodes;
   a second plurality of sensor electrodes comprising second transmitter electrodes and second receiver electrodes; and
   a processing system comprising:
      a first integrated circuit coupled to said first plurality of sensor electrodes and configured to transmit a first transmitter signal with at least one of said first transmitter electrodes and to receive first resulting signals with said first receiver electrodes, wherein said first resulting signals comprise effects corresponding to said first transmitter signal;
      a second integrated circuit coupled to said second plurality of sensor electrodes and configured to transmit a second transmitter signal with at least one of said second transmitter electrodes and to receive second resulting signals with said second receiver electrodes, wherein said second resulting signals comprise effects corresponding to said second transmitter signal; and
      a central controller communicatively coupled to said first integrated circuit and said second integrated circuit,
      wherein said central controller is configured to transmit a clock signal to said first integrated circuit and said second integrated circuit,
      wherein said clock signal is configured to synchronize transmission of said first transmitter signal and said second transmitter signal at a predetermined frequency, and
      wherein said central controller is configured to receive said first resulting signals from said first integrated circuit and said second resulting signals from said second integrated circuit and is configured to determine positional information from said first resulting signals and said second resulting signals and to communicate said positional information to a host processor.

2. The input device of claim 1 further comprising a third plurality of sensor electrodes and wherein said processing system further comprises a third integrated circuit coupled to said third plurality of sensor electrodes and configured to receive third resulting signals with said third plurality of sensor electrodes.

3. The input device of claim 2, wherein said central controller is further configured to determine said positional information further based on said third resulting signals.

4. The input device of claim 1, wherein determining said positional information comprises determining an image.

5. The input device of claim 1, wherein receiving said first resulting signals with said first integrated circuit and receiving said second resulting signals with said second integrated circuit occur concurrently.

6. The input device of claim 1, wherein said central controller is configured to apply a baseline to said first resulting signals and said second resulting signals.

7. The input device of claim 1, wherein said first integrated circuit is configured to receive third resulting signals with said first plurality of sensor electrodes and said second integrated circuit is configured to receive fourth resulting signals with said second plurality of sensor electrodes, and wherein said central controller is configured to determine interference based on said third resulting signals and said fourth resulting signals.

8. The input device of claim 1, wherein said central controller is configured to wake-up said input device based on said first resulting signals and said second resulting signals.

9. The input device of claim 1, wherein said central controller is configured to control one or more characteristic of said first integrated circuit and said second integrated circuit.

10. A processing system for a capacitive sensing device comprising:
a first integrated circuit configured to couple to a first plurality of sensor electrodes, said first plurality of sensor electrodes comprising first transmitter electrodes and first receiver electrodes, said first integrated circuit further configured to transmit a first transmitter signal to at least one of said first transmitter electrodes and to receive first resulting signals from said first receiver electrodes, wherein said first resulting signals comprise effects corresponding to said first transmitter signal;
a second integrated circuit configured to couple to a second plurality of sensor electrodes, said second plurality of sensor electrodes comprising second transmitter electrodes and second receiver electrodes, said second integrated circuit further configured to transmit a second transmitter signal to at least one of said second transmitter electrodes and to receive second resulting signals from said second receiver electrodes, wherein said second resulting signals comprise effects corresponding to said second transmitter signal; and
a central controller communicatively coupled to said first integrated circuit and said second integrated circuit,
wherein said central controller is configured to transmit a clock signal to said first integrated circuit and said second integrated circuit,
wherein said clock signal is configured to synchronize transmission of said first transmitter signal and said second transmitter signal at a predetermined frequency, and
wherein said central controller is configured to receive said first resulting signals from said first integrated circuit and said second resulting signals from said second integrated circuit and is configured to determine positional information from said first resulting signals and said second resulting signals and to communicate said positional information to a host processor.

11. The processing system of claim 10, further a third integrated circuit coupled to a third plurality of sensor electrodes and configured to receive third resulting signals with said third plurality of sensor electrodes, and wherein said central controller is further configured to determine said positional information further based on said third resulting signals.

12. The processing system of claim 10, wherein determining said positional information comprises determining an image.

13. The processing system of claim 10, wherein receiving said first resulting signals with said first integrated circuit and receiving said second resulting signals with said second integrated circuit occur concurrently.

14. The processing system of claim 10, wherein said central controller is configured to apply a baseline to said first resulting signals and said second resulting signals.

15. The processing system of claim 10, wherein said first integrated circuit is configured to receive third resulting signals with said first plurality of sensor electrodes and said second integrated circuit is configured to receive fourth resulting signals with said second plurality of sensor electrodes, and wherein said central controller is configured to determine interference based on said third resulting signals and said fourth resulting signals.

16. The processing system of claim 10, wherein said central controller is configured to wake-up said host processor based on said first resulting signals and said second resulting signals.

17. The processing system of claim 10, wherein said central controller is configured to control one or more characteristic of said first integrated circuit and said second integrated circuit.

* * * * *